(12) United States Patent
Wu et al.

(10) Patent No.: US 12,532,533 B2
(45) Date of Patent: Jan. 20, 2026

(54) METHOD FOR FORMING SEMICONDUCTOR STRUCTURE

(71) Applicant: Taiwan Semiconductor Manufacturing Company, Ltd., Hsinchu (TW)

(72) Inventors: Chi-Wei Wu, Hsinchu (TW); Hsin-Che Chiang, Taipei (TW); Jeng-Ya Yeh, New Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 632 days.

(21) Appl. No.: 17/822,454

(22) Filed: Aug. 26, 2022

(65) Prior Publication Data

US 2024/0071829 A1    Feb. 29, 2024

(51) Int. Cl.
| | | |
|---|---|---|
| *H10D 84/03* | (2025.01) | |
| *H01L 21/762* | (2006.01) | |
| *H10B 10/00* | (2023.01) | |
| *H10D 84/01* | (2025.01) | |
| *H10D 84/83* | (2025.01) | |

(52) U.S. Cl.
CPC ..... *H10D 84/038* (2025.01); *H01L 21/76232* (2013.01); *H10B 10/12* (2023.02); *H10B 10/18* (2023.02); *H10D 84/0142* (2025.01); *H10D 84/0151* (2025.01); *H10D 84/0158* (2025.01); *H10D 84/013* (2025.01)

(58) Field of Classification Search
CPC .......... H01L 21/76232; H10D 84/0142; H10D 84/0135; H10D 84/013; H10D 84/0151; H10D 84/038; H10D 84/0158; H10B 10/18
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |

(Continued)

*Primary Examiner* — Sonya McCall-Shepard
(74) *Attorney, Agent, or Firm* — McClure, Qualey & Rodack, LLP

(57) ABSTRACT

A method for forming a semiconductor structure is provided. The method for forming the semiconductor structure includes forming first fin structures and a second fin structures over a substrate, forming a first gate stack and a second gate stack that extend in a first direction across the first fin structures and the second fin structures, respectively, and etching the first gate stack and the second gate stack to form a first trench through the first gate stack and a second trench through the second gate stack. A first dimension of the first trench in the first direction is greater than a second dimension of the second trench in the first direction. The method further includes forming a first gate cutting structure and a second gate cutting structure in the first trench and the second trench, respectively.

20 Claims, 33 Drawing Sheets

(56) References Cited

U.S. PATENT DOCUMENTS

2020/0251325 A1\* 8/2020 Wen .................. H01L 21/32155
2021/0020636 A1\* 1/2021 Lee .................... H10D 84/0188
2021/0343709 A1\* 11/2021 Wang ..................... H10B 99/00

\* cited by examiner

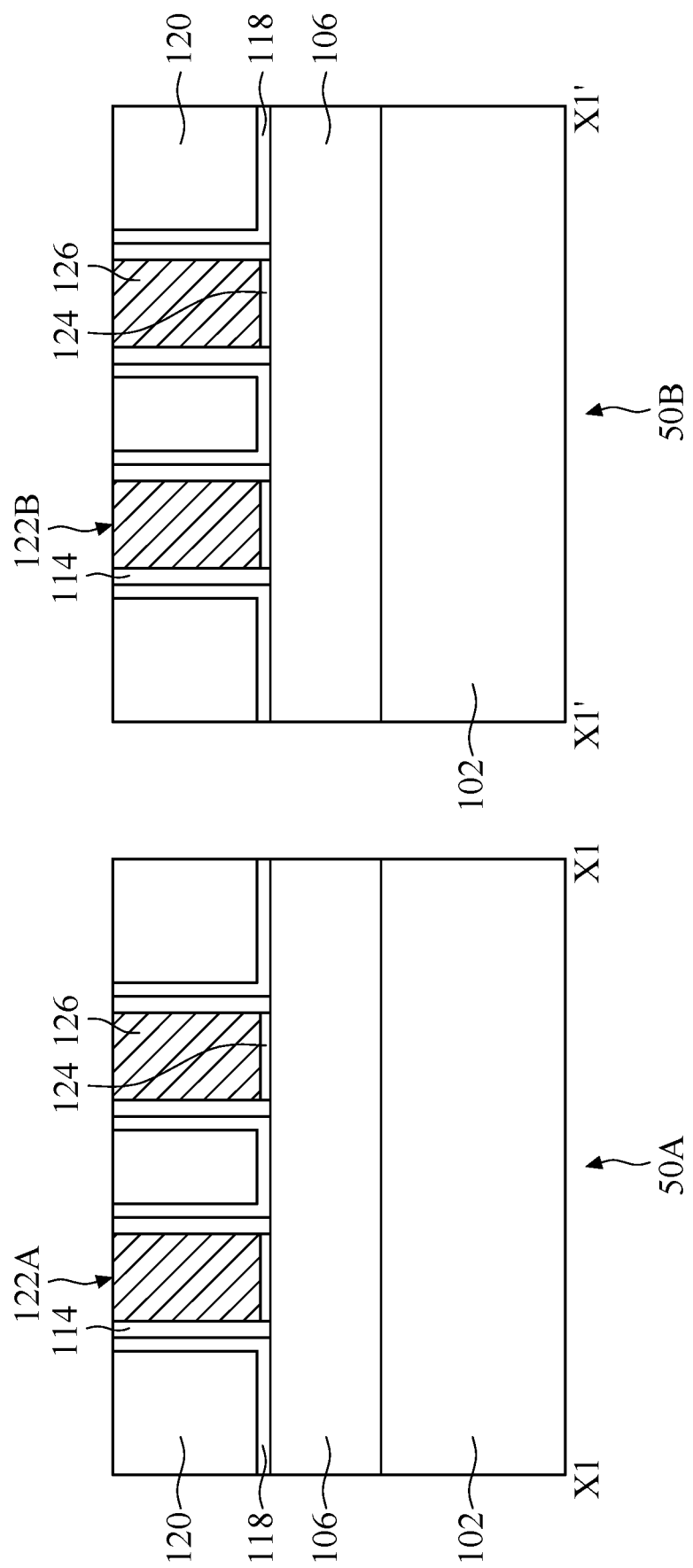

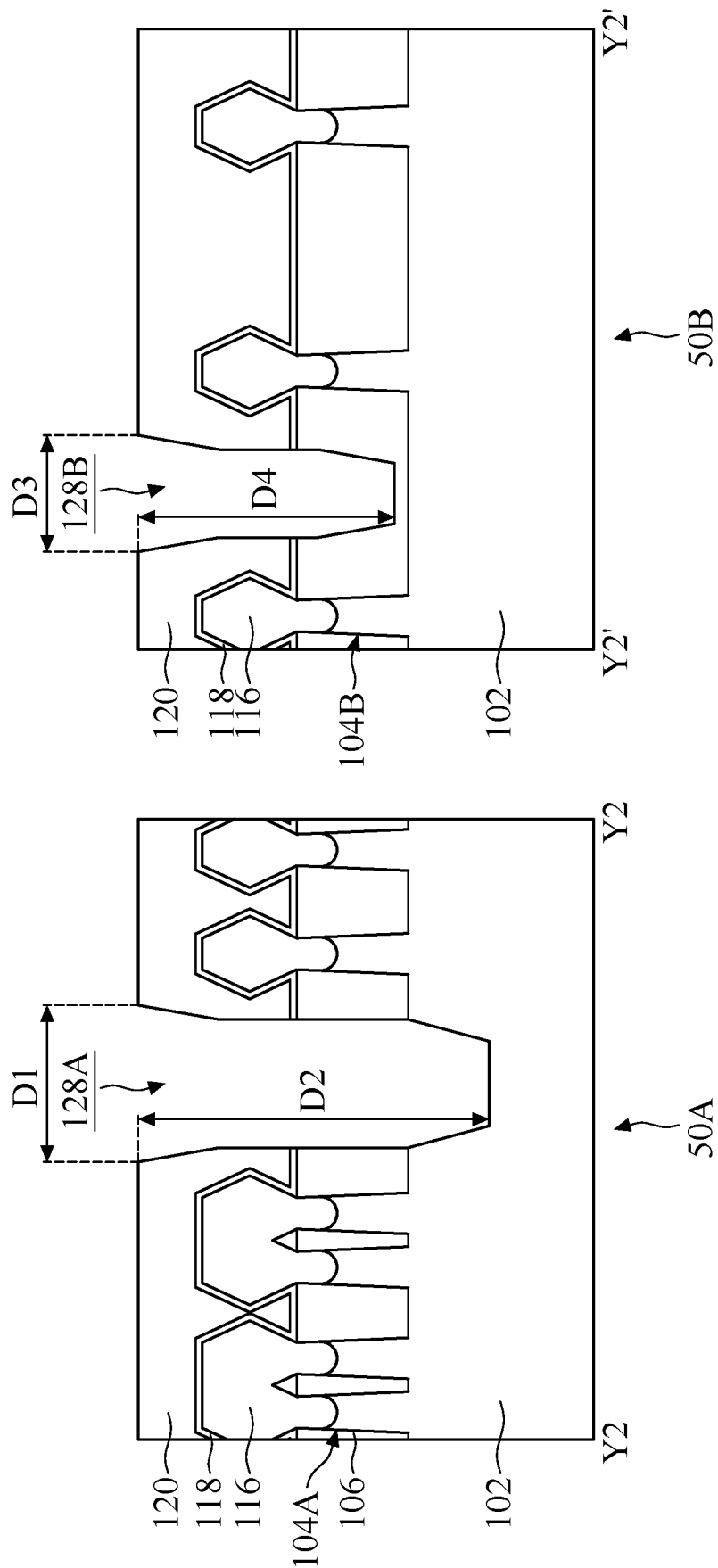

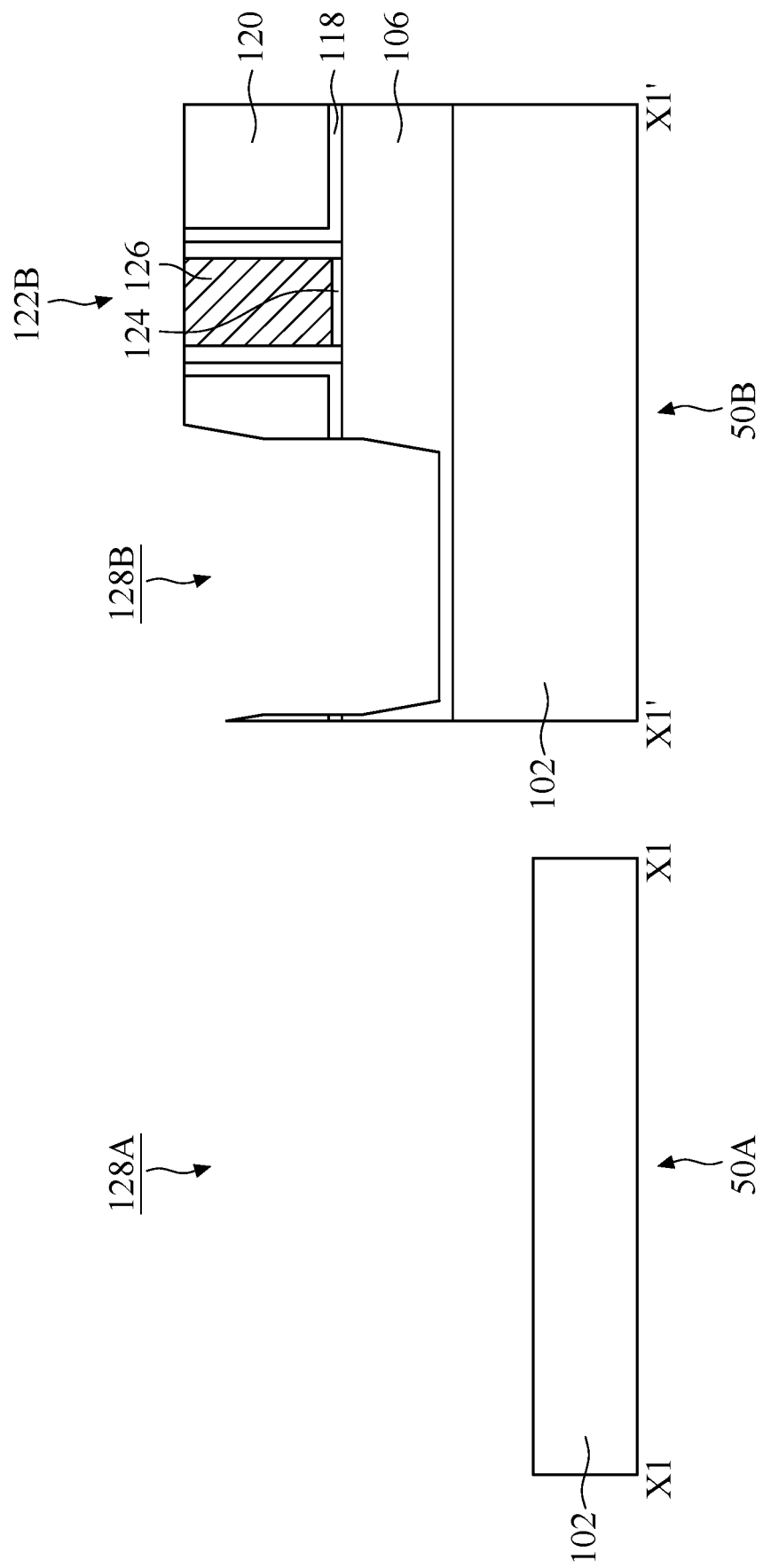

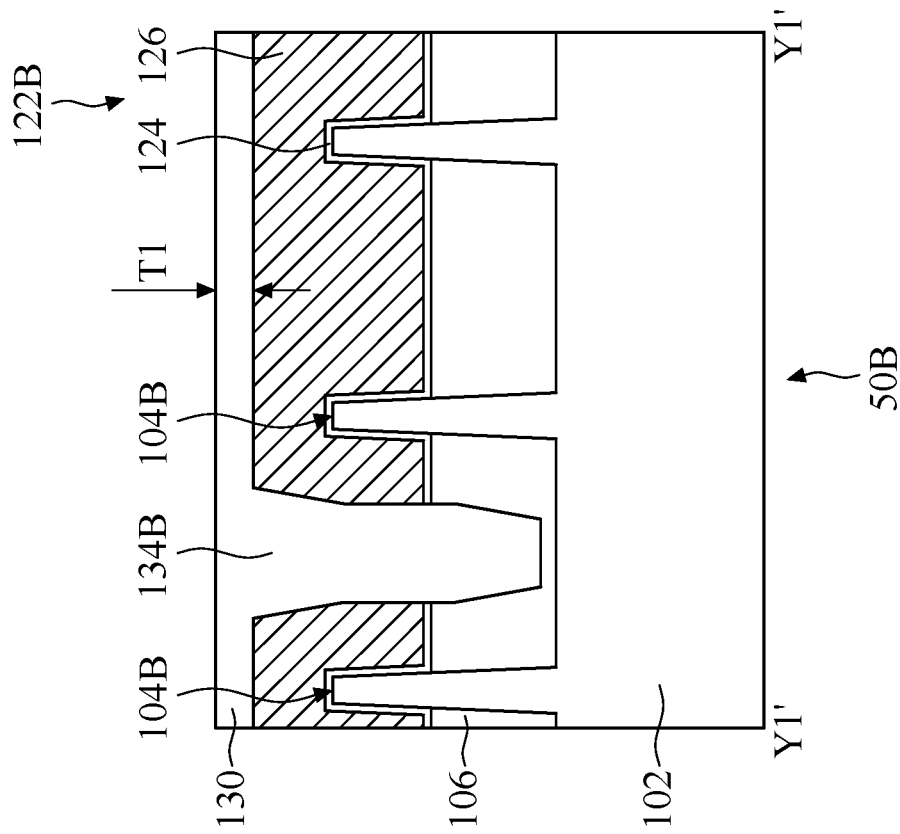
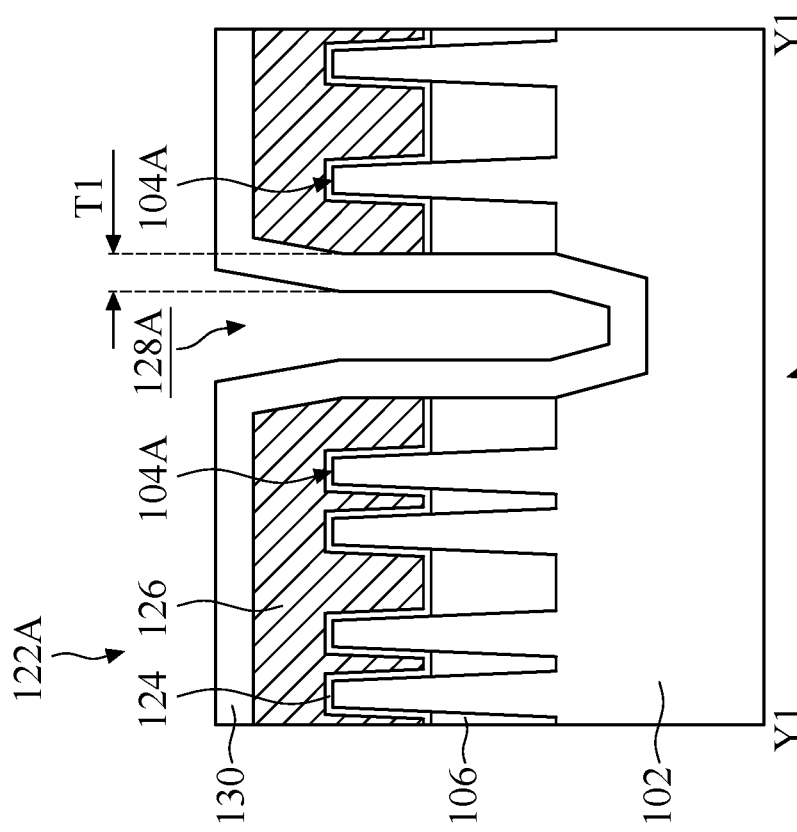
FIG. 2E-2
FIG. 2E-1

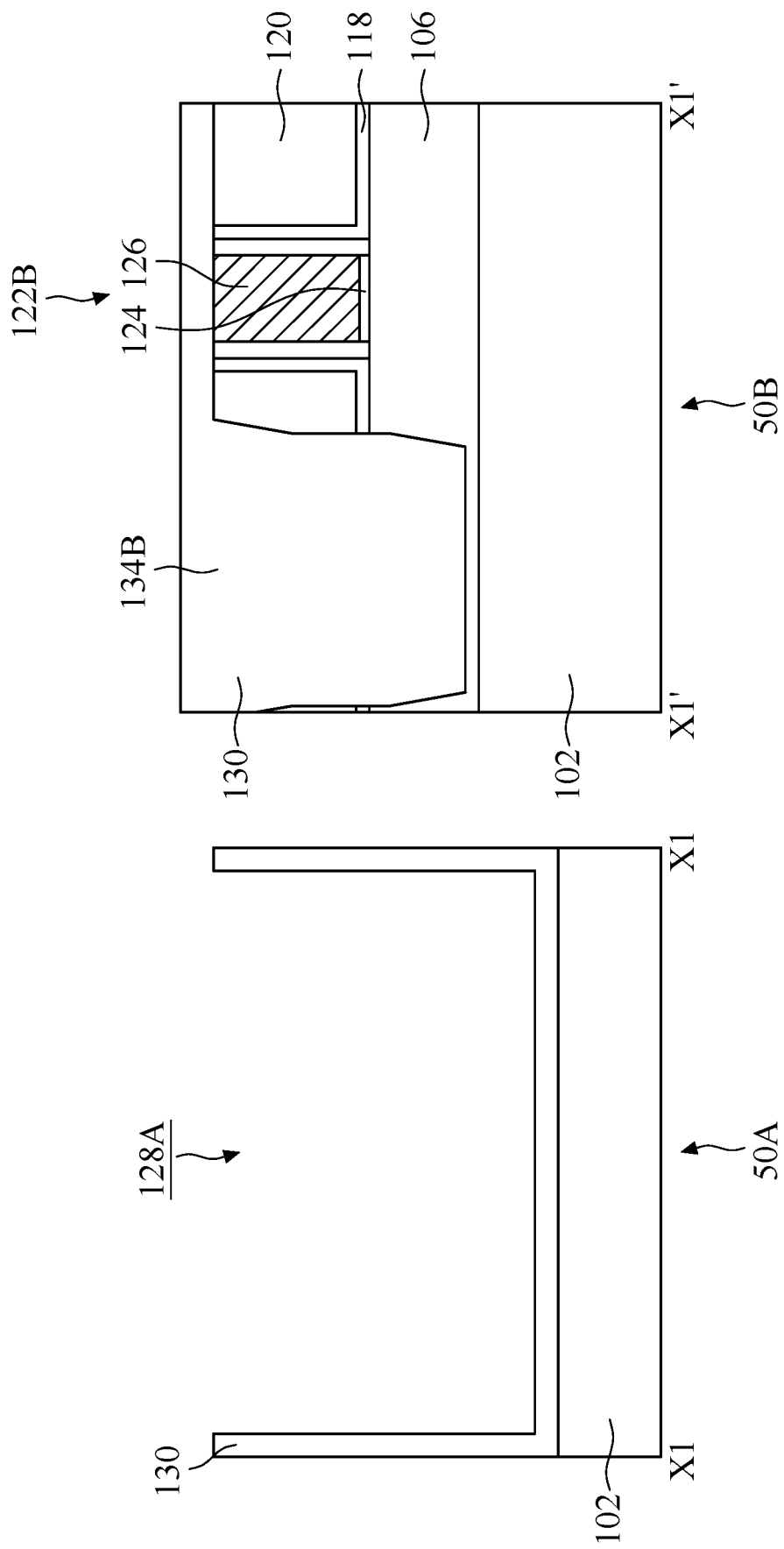

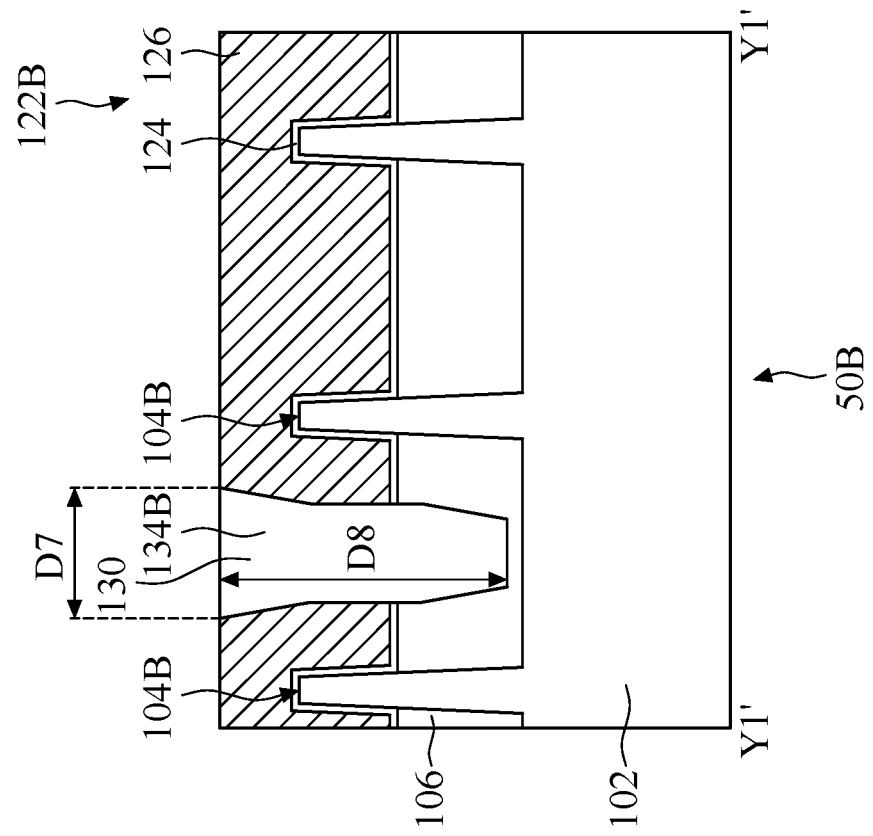
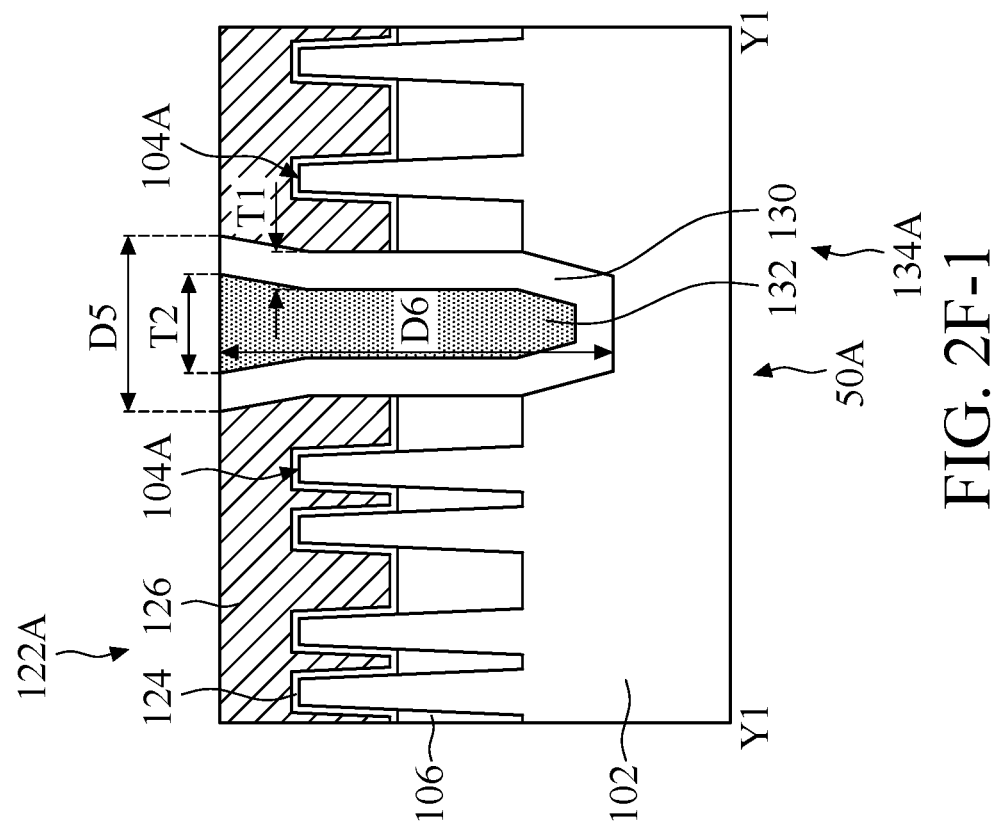
FIG. 2F-2
FIG. 2F-1

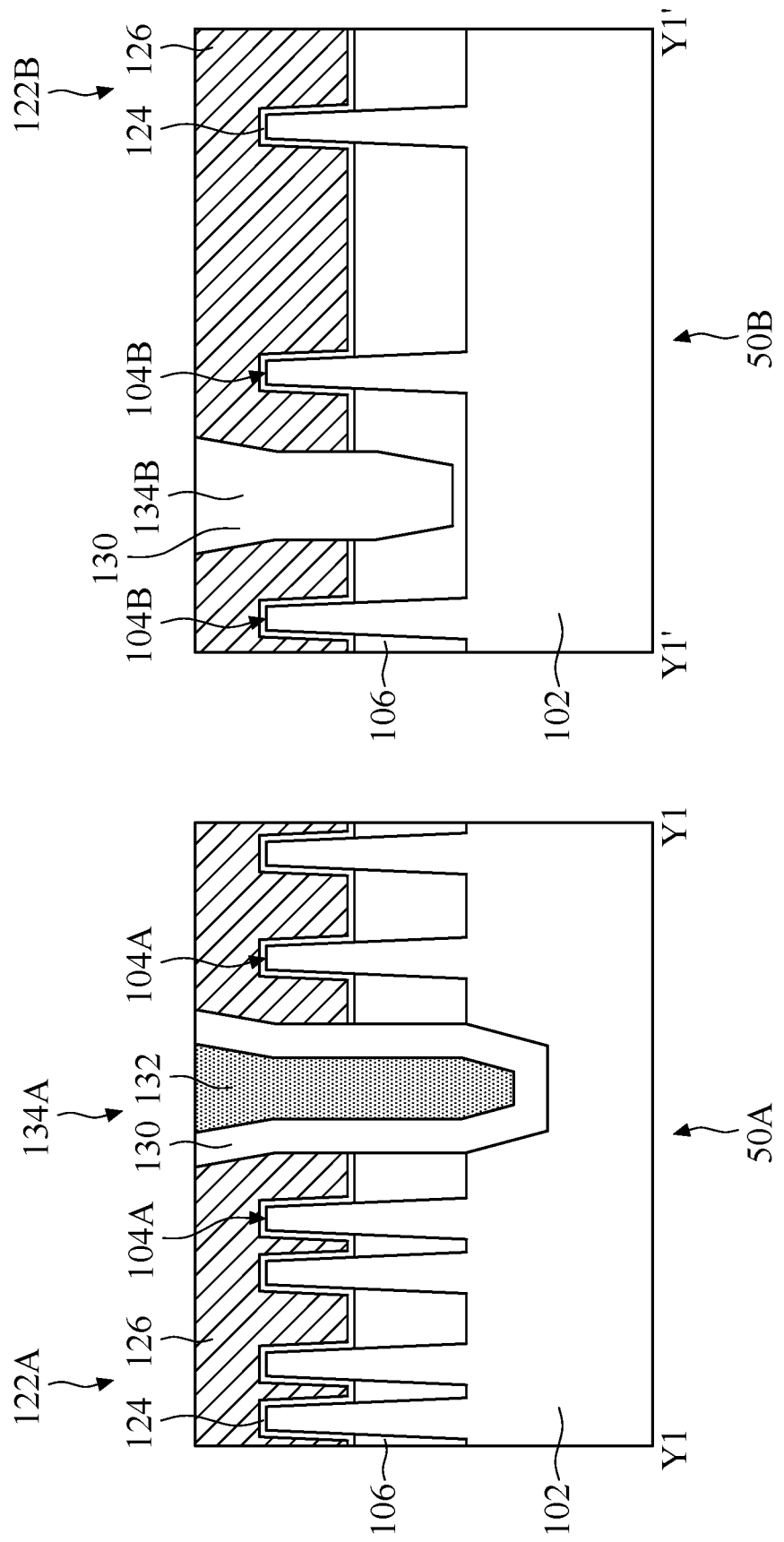

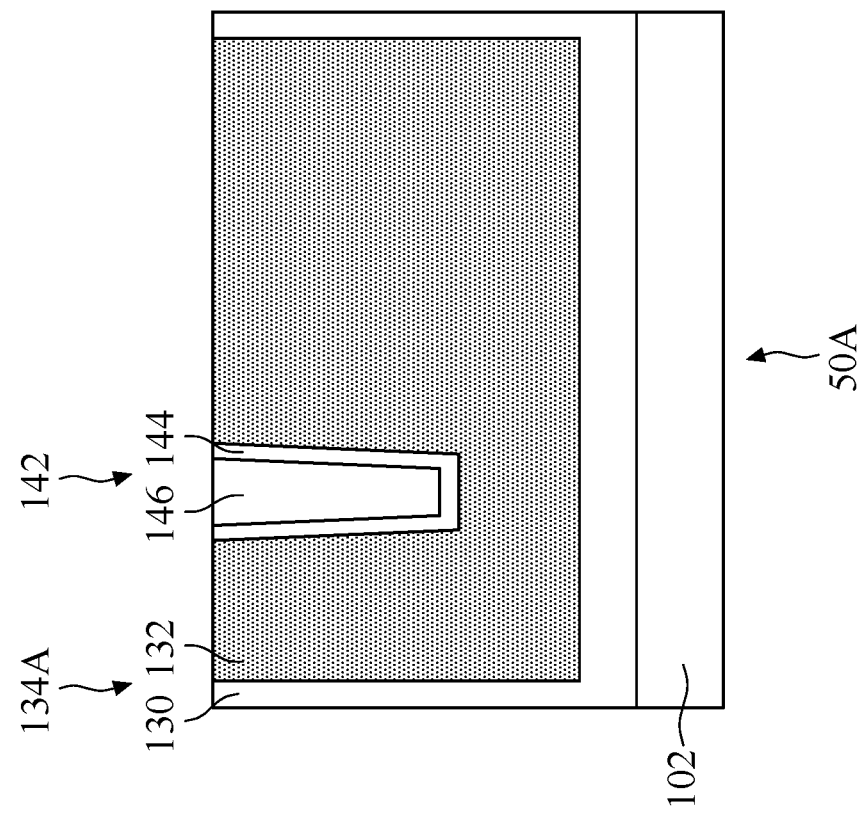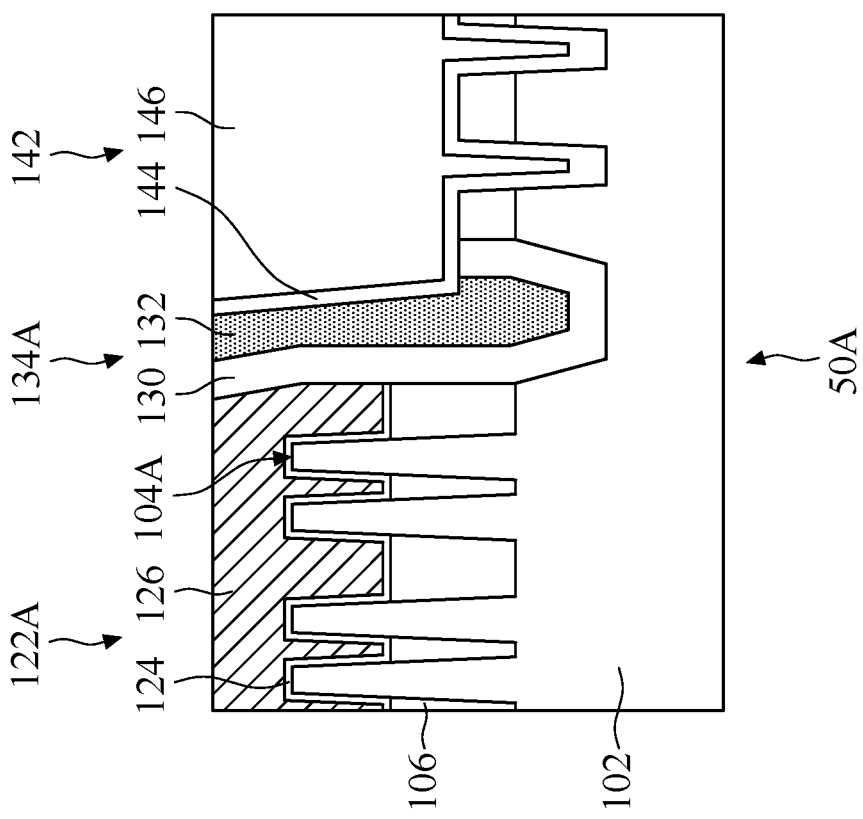
FIG. 4B-1
FIG. 4B-2

METHOD FOR FORMING SEMICONDUCTOR STRUCTURE

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. The advantages of a FinFET may include reducing the short channel effect and providing a higher current flow.

BRIEF DESCRIPTION OF THE DRAWINGS

Aspects of the present disclosure are best understood from the following detailed description when read with the accompanying Figures. It should be noted that, in accordance with the standard practice in the industry, various features are not drawn to scale. In fact, the dimensions of the various features may be arbitrarily increased or reduced for clarity of discussion.

FIGS. 2A-1 and 2A-2 are cross-sectional views of the semiconductor structure taken along line Y1-Y1 and line Y1'-Y1' of FIG. 2A, respectively.

FIGS. 2B-1, 2B-2, 2B-3 and 2B-4 are cross-sectional views of the semiconductor structure taken along line Y1-Y1, line Y1'-Y1', line Y2-Y2 and line Y2'-Y2' of FIG. 2B, respectively.

FIGS. 2C-1, 2C-2, 2C-3, 2C-4, 2C-5 and 2C-6 are cross-sectional views of the semiconductor structure taken along line Y1-Y1, line Y1'-Y1', line Y2-Y2, line Y2'-Y2', line X1-X1 and line X1'-X1' of FIG. 2C, respectively.

FIGS. 2D-1, 2D-2, 2D-3, 2D-4, 2D-5 and 2D-6 are cross-sectional views of the semiconductor structure taken along line Y1-Y1, line Y1'-Y1', line Y2-Y2, line Y2'-Y2', line X1-X1 and line X1'-X1' of FIG. 2D, respectively.

FIGS. 2E-1, 2E-2, 2E-3, 2E-4, 2E-5 and 2E-6 are cross-sectional views of the semiconductor structure taken along line Y1-Y1, line Y1'-Y1', line Y2-Y2, line Y2'-Y2', line X1-X1 and line X1'-X1' of FIG. 2E, respectively.

FIGS. 2F-1, 2F-2, 2F-3, 2F-4, 2F-5 and 2F-6 are cross-sectional views of the semiconductor structure taken along line Y1-Y1, line Y1'-Y1', line Y2-Y2, line Y2'-Y2, line X1-X1 and line X1'-X1' of FIG. 2F, respectively.

FIGS. 2G-1, 2G-2, 2G-3, 2G-4, 2G-5 and 2G-6 are cross-sectional views of the semiconductor structure taken along line Y1-Y1, line Y1'-Y1', line Y2-Y2, line Y2'-Y2', line X1-X1 and line X1'-X1' of FIG. 2G, respectively.

FIGS. 3-1 and 3-2 illustrates a modification of the semiconductor structure of FIGS. 2G-3 and 2G-4, in accordance with some embodiments of the disclosure.

FIGS. 4A-1 and 4A-2 are cross-sectional views of the semiconductor structure taken along line Y1-Y1 and line X1-X1 of FIG. 4A, respectively.

FIGS. 4B-1 and 4B-2 are cross-sectional views of the semiconductor structure taken along line Y1-Y1 and line X1-X1 of FIG. 4B, respectively.

FIGS. 4C-1 and 4C-2 are cross-sectional views of the semiconductor structure taken along line Y1-Y1 and line X1-X1 of FIG. 4C, respectively.

DETAILED DESCRIPTION

Figure 1:
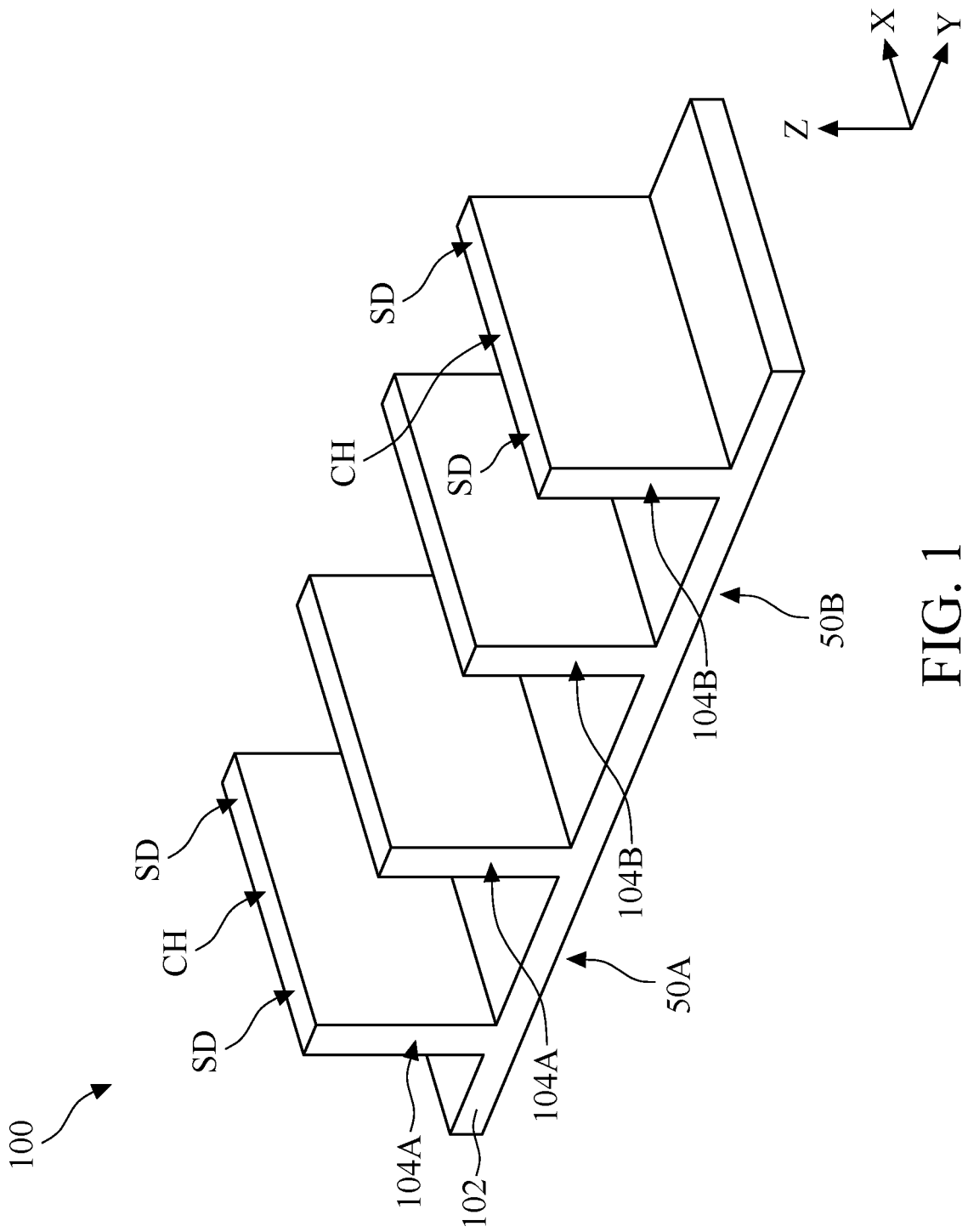
FIG. 1 is a perspective view of a semiconductor structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

Fin structures described below may be patterned by any suitable method. For example, the fins may be patterned using one or more lithography processes, including double-patterning or multi-patterning processes. Generally, double-patterning or multi-patterning processes combine lithography and self-aligned processes, allowing patterns to be created that have, for example, pitches smaller than what is otherwise obtainable using a single, direct lithography process. For example, in one embodiment, a sacrificial layer is formed over a substrate and patterned using a lithography process. Spacers are formed alongside the patterned sacrificial layer using a self-aligned process. The sacrificial layer is then removed, and the remaining spacers may then be used to pattern the fins.

Embodiments of forming a semiconductor structure are provided. The aspect of the present disclosure is directed to forming a gate cutting structure. In some embodiments, the logic devices may focus more on device performance, e.g., speed, while the memory devices may focus more on device density. A first gate cutting structure in the logic region is greater than a second gate cutting structure in the memory cell array region, in accordance with some embodiments. The first gate cutting structure with a relatively great width, and thus the parasitic capacitance of the resulting logic devices may be reduced, thereby enhancing the performance of the logic devices. The second gate cutting structures have a relatively small width, and thus the density of the resulting memory devices may be improved.

FIG. 1 is a perspective view of a semiconductor structure 100, in accordance with some embodiments of the disclosure. The semiconductor structure 100 includes a substrate 102, in accordance with some embodiments. The semiconductor structure 100 (or the substrate 102) may include various device regions, e.g., a logic region, a memory cell array region, an analog region, a peripheral region (e.g., an input/output area), another suitable region, or a combination thereof. FIG. 1 illustrates a logic region 50A and a memory cell array region 50B of the semiconductor structure 100 (or the substrate 102), in accordance with some embodiments. The logic region 50A and the memory cell array region 50B are part of an integrated circuit (IC) device, in accordance with some embodiments.

Logic devices (e.g., inverter, NAND, NOR, ring operator, etc.) are to be formed in the logic region 50A, and the memory devices (e.g., SRAM (Static Random-Access Memory), DRAM (Dynamic Random Access Memory), or Flash memory) are to be formed in the memory cell array region 50B, in accordance with some embodiments. The logic devices perform the designed functions of an integrated circuit (IC) device, and the memory devices are operable as data storage, in accordance with some embodiments. The logic devices may be operable to access and/or control (e.g., perform read/write/erase operation) the memory devices, in accordance with some embodiments. Although the logic region 50A and the memory cell array region 50B are shown as being immediately adjacent to one another in FIG. 1, the logic region 50A and the memory cell array region 50B may be spaced apart from one another by another device region, in accordance with some embodiments.

For a better understanding of the semiconductor structure, an X-Y-Z coordinate reference is provided in FIG. 1. The X-axis and Y-axis are generally orientated along the lateral (or horizontal) directions that are parallel to the main surface of the semiconductor structure. The Y-axis is transverse (e.g., perpendicular or substantially perpendicular) to the X-axis. The Z-axis is generally oriented along the vertical direction that is perpendicular to the main surface of a semiconductor structure (or the X-Y plane).

The semiconductor structure 100 includes fin structures 104A over the logic region 50A of the substrate 102, and fin structures 104B over the memory cell array region 50B of the substrate 102, as shown in FIG. 1, in accordance with some embodiments. The fin structures 104A and 104B extend in the X direction, in accordance with some embodiments. That is, the fin structures 104A and 104B have longitudinal axes parallel to the X direction, in accordance with some embodiments. The X direction may also be referred to as the channel-extending direction. The current of the resulting semiconductor devices (i.e., FinFETs) flows in the X direction through the channel.

Each of the fin structures 104A and 104B is defined as several channel regions CH and source/drain regions SD, where the channel regions CH and the source/drain regions SD are alternately arranged, in accordance with some embodiments. In this disclosure, a source/drain refers to a source and/or a drain. It should be noted that in the present disclosure, a source and a drain are used interchangeably and the structures thereof are substantially the same. FIG. 1 shows one channel region CH and two source/drain regions SD for illustrative purposes and is not intended to be limiting. The number of channel regions CH and source/drain regions SD may be dependent on the demands on the design of the circuit and/or performance considerations of the semiconductor device. Gate structures or gate stacks (not shown) will be formed with longitudinal axes parallel to the Y direction and extending across and/or surrounding the channel regions CH of the fin structures 104A and 104B. The Y direction may also be referred to as a gate-extending direction.

FIGS. 2A, 2B, 2C, 2D, 2E, 2F and 2G are plan views illustrating the formation of a semiconductor structure 100 at various intermediate stages, in accordance with some embodiments of the disclosure.

Figure 2A:
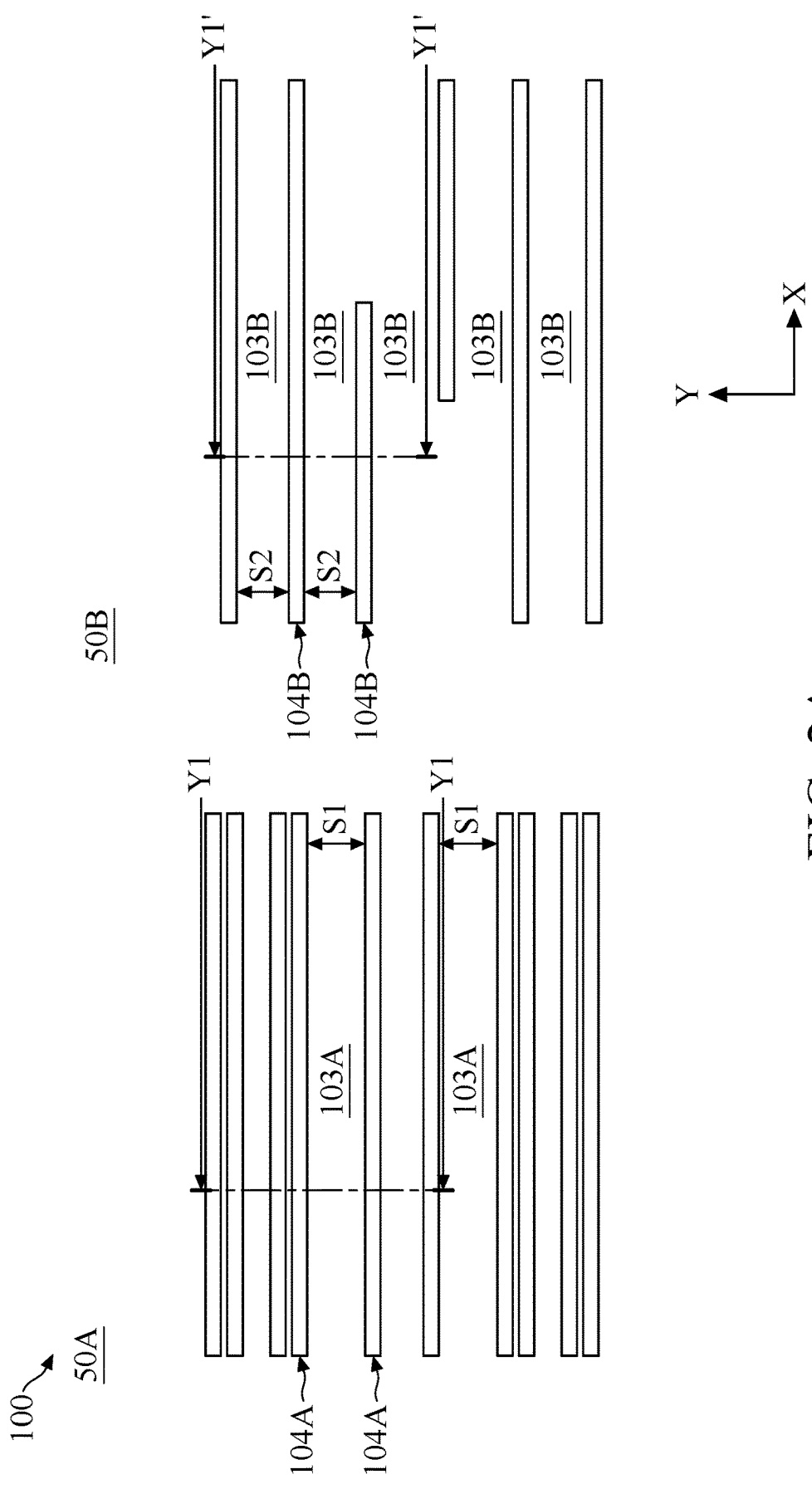
FIGS. 2A, 2B, 2C, 2D, 2E, 2F and 2G are plan views illustrating the formation of a semiconductor structure at various intermediate stages, in accordance with some embodiments of the disclosure.
Figures 1, 2, 2A:
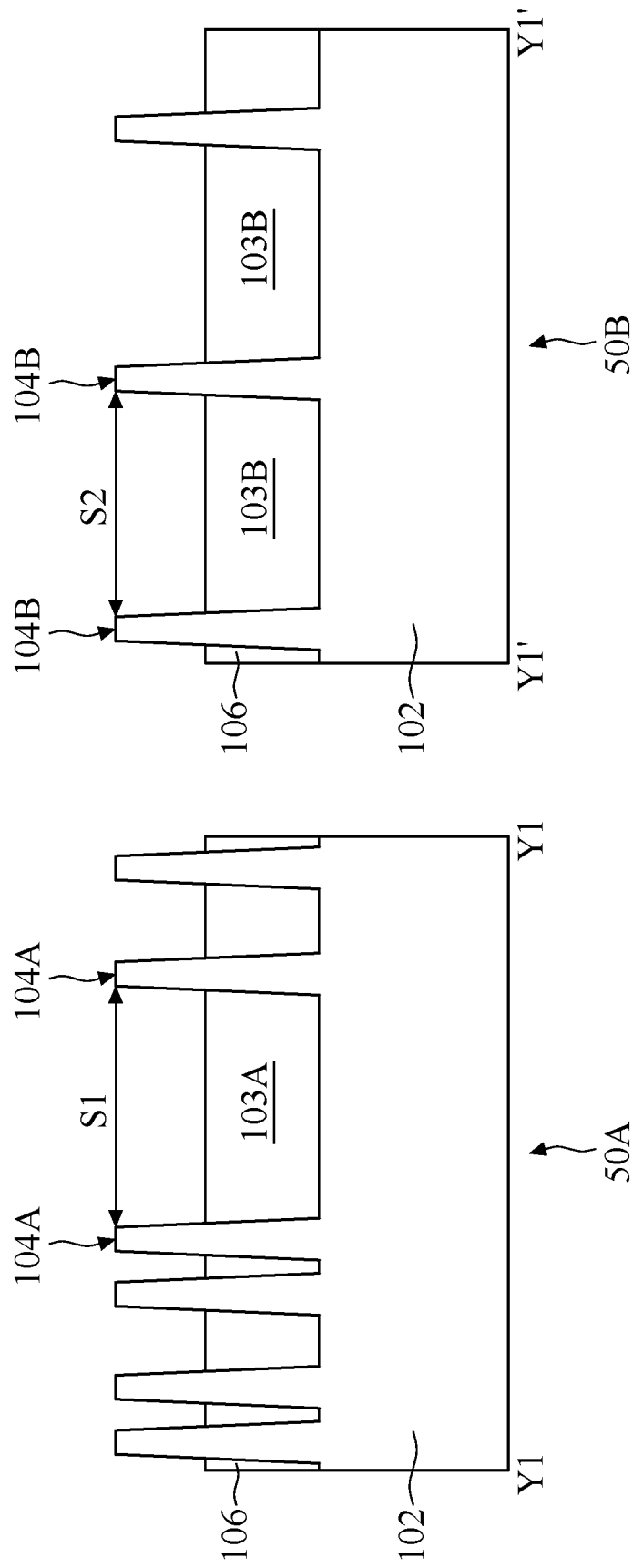

FIGS. 2A through 2A-2 illustrate a semiconductor structure 100 after the formation of fin structures 104A, fin structures 104B and an isolation structure 106, in accordance with some embodiments. FIGS. 2A-1 and 2A-2 are cross-sectional views of the semiconductor structure 100 taken along line Y1-Y1 and line Y1'-Y1' of FIG. 2A, respectively. It should be noted that the plan views in the present disclosure only illustrate some components of the semiconductor structure 100 for illustrative purposes, some other components of the semiconductor structure 100 may be shown in the cross-sectional views.

The semiconductor structure 100 includes a substrate 102, as shown in FIGS. 2A, 2A-1 and 2A-2 in accordance with some embodiments. Some areas of the substrate 102 are defined as a logic region 50A for forming logic devices thereon and a memory cell array region 50B for forming memory devices (e.g., SRAM) thereon, as shown in FIGS. 2A, 2A-1 and 2A-2, in accordance with some embodiments. In some embodiments, the logic region 50A and the memory cell array region 50B are immediately adjacent to one another. In some other embodiments, the logic region 50A and the memory cell array region 50B may be spaced apart from one another by another device region.

The substrate 102 may be a portion of a semiconductor wafer, a semiconductor chip (or die), and the like. In some embodiments, the substrate 102 is a silicon substrate. In some embodiments, the substrate 102 includes an elementary semiconductor such as germanium; a compound semiconductor such as gallium nitride (GaN), silicon carbide (SiC), gallium arsenide (GaAs), gallium phosphide (GaP), indium phosphide (InP), indium arsenide (InAs), and/or indium antimonide (InSb); an alloy semiconductor such as SiGe, GaAsP, AlInAs, AlGaAs, GaInAs, GaInP, and/or GaInAsP; or a combination thereof. Furthermore, the substrate 102 may optionally include an epitaxial layer (epi-layer), may be strained for performance enhancement, may include a silicon-on-insulator (SOI) structure, and/or have other suitable enhancement features.

A plurality of fin structures 104A are formed in the logic region 50A, and a plurality of the fin structures 104B are formed in the memory cell array region 50B, as shown in FIGS. 2A, 2A-1 and 2A-2, in accordance with some embodiments. In some embodiments, the fin structures 104A and 104B extend in the X direction. The fin structures 104A and 104B have longitudinal axes parallel to the X direction, in accordance with some embodiments. That is, the dimensions (lengths) of the fin structures 104A and 104B in the X direction are greater than the dimensions (widths) of the fin structures 104A and 104B in the Y direction.

The formation of the fin structures 104A and 104B includes patterning the substrate 102 thereby forming 103A and 103B in the logic region 50A and the memory cell array region 50B, respectively, in accordance with some embodiments. The portions of the substrate 102 that protrude from between the trenches 103A serve as the fin structures 104A, in accordance with some embodiments. The portions of the substrate 102 that protrude from between the trenches 103B serve as the fin structures 104B, in accordance with some embodiments. The patterning may include photolithography and etching processes.

In some embodiments, the width of the fin structure 104A is substantially the same as the width of the fin structure 104B. In the logic region 50A, the spacing between two adjacent fin structures 104A in the Y direction may be different. The spacings S1 may be the spacing with a larger dimension or the maximum dimension in the logic region 50A, and gate cutting structures are predetermined to be formed in the spacing S1, in accordance with some embodiments. In memory cell array region 50B, the spacing S2 between two adjacent fin structures 104B in the Y direction may be substantially the same, and gate cutting structures are predetermined to be formed in the spacing S2, in accordance with some embodiments. In some other embodiments, the spacing S2 between two adjacent fin structures 104B in the Y direction may be different.

In some embodiments, the device density is more of a concern in the memory cell array region 50B than in the logic region 50A. As a result, the spacing S2 may be less than spacing S1, in accordance with some embodiments. In some embodiments, the ratio (S2/D1) of the spacing S2 to the spacing S1 is in a range from about 0.3 to about 0.8, e.g., from about 0.4 to about 0.6.

An isolation structure 106 is formed over the substrate 102 to partially fill the trenches 103A and 104A, as shown in FIGS. 2A-1 and 2A-2, in accordance with some embodiments. The isolation structure 106 may be also referred to as shallow trench isolation (STI) feature. In some embodiments, the isolation structure 106 is made of dielectric material such as silicon oxide ($SiO_2$), silicon nitride (SiN), silicon oxynitride (SiON), silicon carbide (SiC), oxygen-doped silicon carbide (SiC:O), oxygen-doped silicon carbonitride (Si(O)CN), or a combination thereof.

In some embodiments, the formation of the isolation structure 106 includes depositing a dielectric material for the isolation structure 106 to overfill the trenches 103A and 103B. In some embodiments, the dielectric material is deposited using chemical vapor deposition (CVD) (such as FCVD, LPCVD, PECVD, HDP-CVD, or HARP), ALD, another suitable technique, and/or a combination thereof.

The dielectric material formed over the tops of the fin structures 104A and 104B is planarized, for example, using CMP, etching back process, or a combination thereof, in accordance with some embodiments. The dielectric material is further recessed using an etching process to expose the sidewalls of the fin structures 104A and 104B, in accordance with some embodiments. A remainder of the dielectric material serves as the isolation structure 106, in accordance with some embodiments.

Figure 2B:
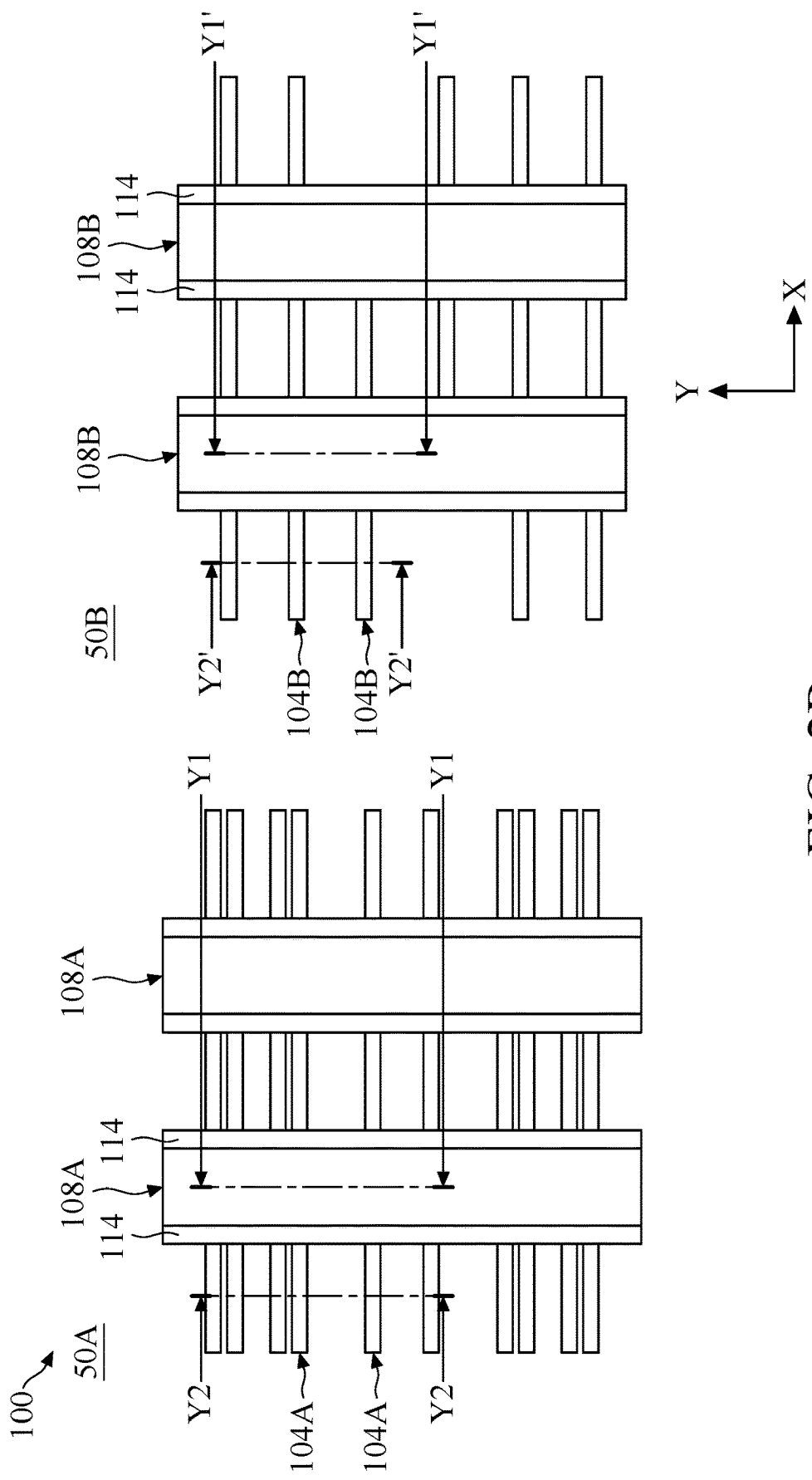
Figures 1, 2B:
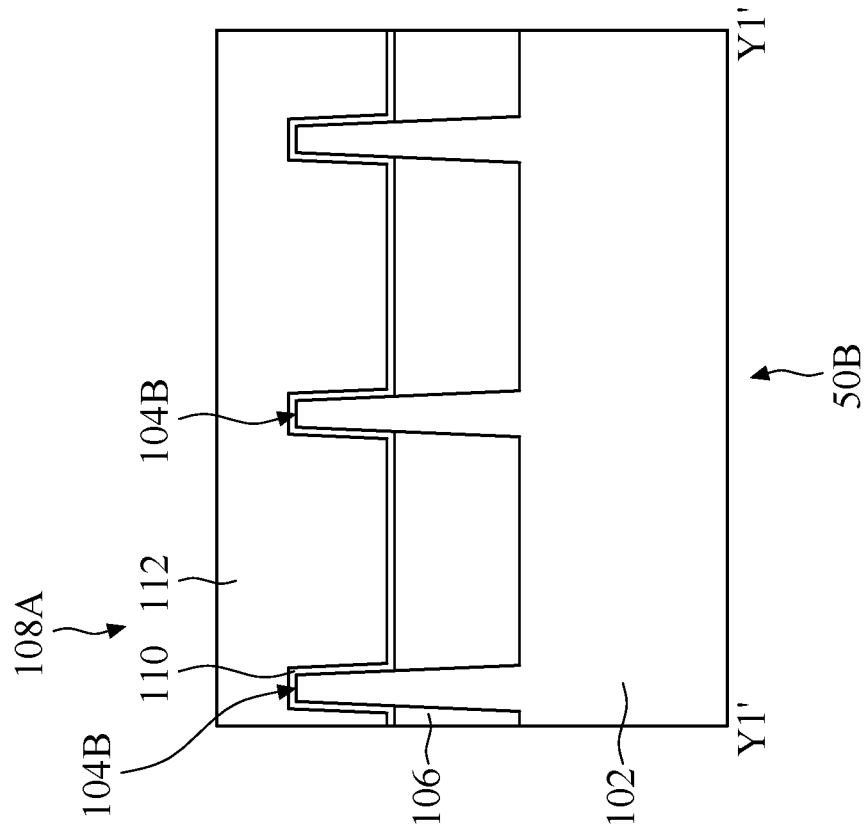
Figures 2, 2B:
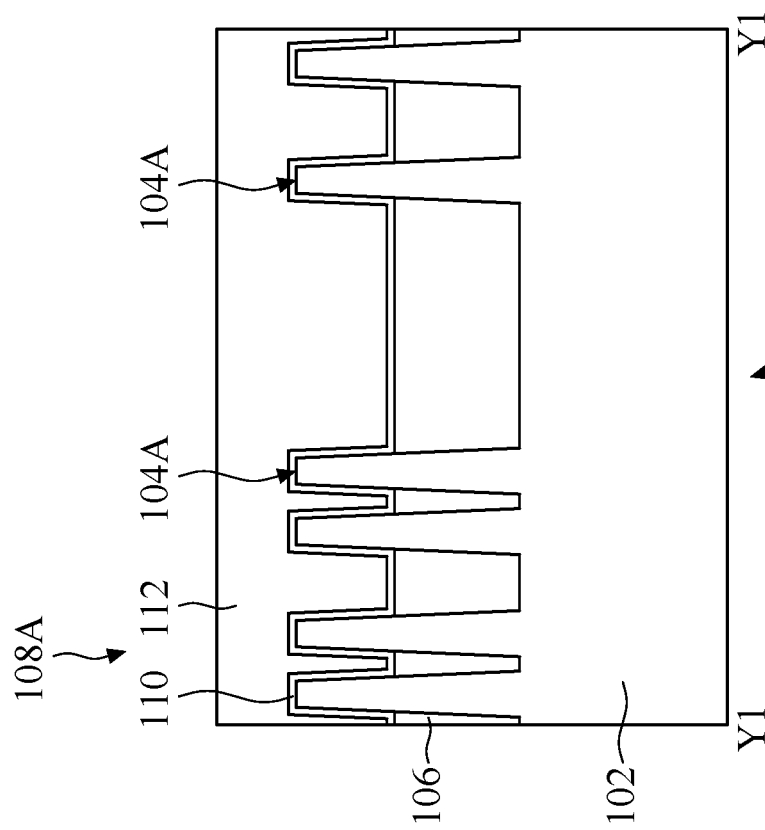
Figures 2, 2B, 3:
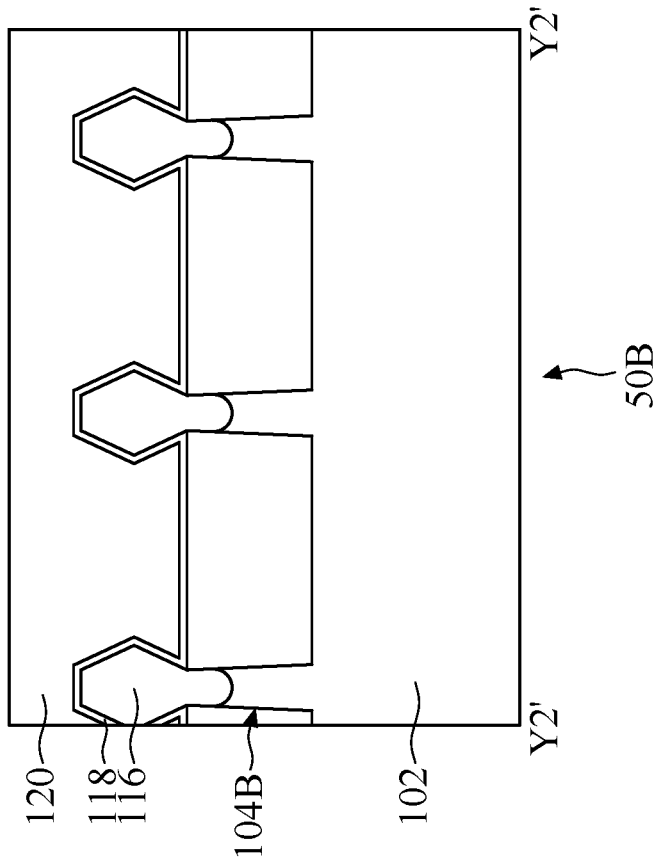
Figures 2, 2B, 3, 4:
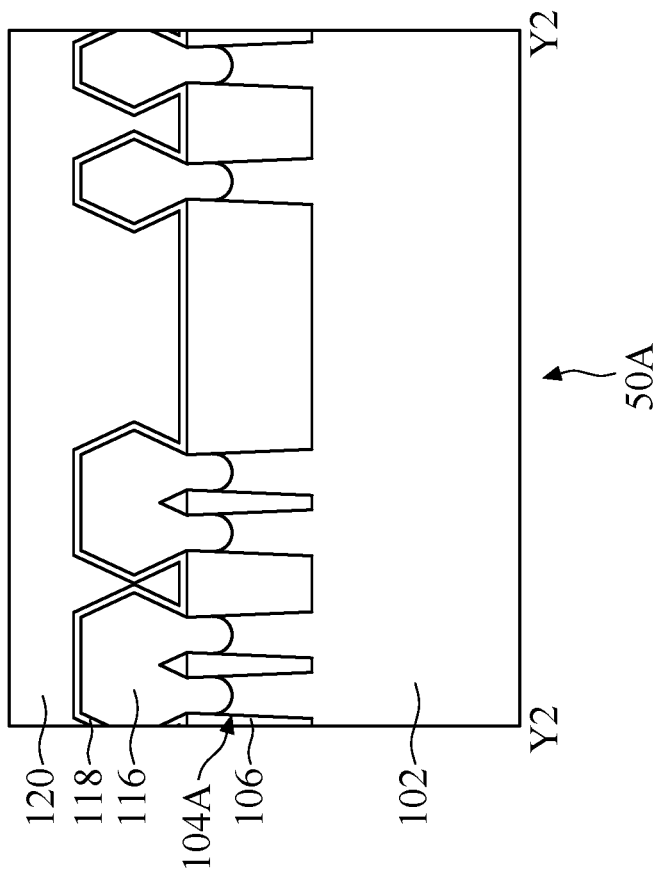

FIGS. 2B through 2B-4 illustrate a semiconductor structure 100 after the formation of dummy gate structures 108A, dummy gate structures 108B, gate spacer layers 114, source/drain features 116, a contact etching stop layer (CESL) 118 and an interlayer dielectric (ILD) layer 120, in accordance with some embodiments. FIGS. 2B-1, 2B-2, 2B-3 and 2B-4 are cross-sectional views of the semiconductor structure 100 taken along line Y1-Y1, line Y1'-Y1', line Y2-Y2 and line Y2'-Y2' of FIG. 2B, respectively.

Dummy gate structures 108A and 108B are formed over the semiconductor structure 100, as shown in FIGS. 2B, 2B-1 and 2B-2, in accordance with some embodiments. The dummy gate structures 108A are formed in the logic region 50A and extend across and surround the channel regions of the fin structures 104A, in accordance with some embodiments. The dummy gate structures 108B are formed in the memory cell array region 50B and extend across and surround the channel regions of the fin structures 104B, in accordance with some embodiments. The dummy gate structures 108A and 108B are configured as sacrificial structures and will be replaced with final gate stacks, in accordance with some embodiments.

In some embodiments, the dummy gate structures 108A and 108B extend in the Y direction. The dummy gate structures 108A and 108B have longitudinal axes parallel to the Y direction, in accordance with some embodiments. That is, the dimensions (lengths) of the dummy gate structures 108A and 108B in the Y direction are greater than the dimensions (widths) of the dummy gate structures 108A and 108B in the X direction.

Each of the dummy gate structures 108A and 108B includes a dummy gate dielectric layer 110 and a dummy gate electrode layer 112 formed over the dummy gate dielectric layer 110, as shown in FIGS. 2B-1 and 2B-2, in accordance with some embodiments. In some embodiments, the dummy gate dielectric layer 110 is made of one or more dielectric materials, such as silicon oxide (SiO), silicon nitride (SiN), silicon oxynitride (SiON), $HfO_2$, HfZrO, HfSiO, HfMO, HfAlO, and/or a combination thereof. In some embodiments, the dielectric material is formed using ALD, CVD, thermal oxidation, physical vapor deposition (PVD), another suitable technique, and/or a combination thereof.

In some embodiments, the dummy gate electrode layer 112 is made of semiconductor material such as polysilicon, poly-silicon germanium. In some embodiments, the dummy gate electrode layer 112 is made of a conductive material such as metallic nitrides, metallic silicides, metals, and/or a combination thereof. In some embodiments, the material for the dummy gate electrode layer 112 is formed using CVD, another suitable technique, and/or a combination thereof.

In some embodiments, the formation of the dummy gate structures 108A and 108B includes globally and conformally depositing a dielectric material for the dummy gate dielectric layer 110 over the semiconductor structure, depositing a material for the dummy gate electrode layer 112 over the dielectric material, planarizing the material for the dummy gate electrode layer 112, and patterning the dielectric material and the material for the dummy gate electrode layer 112 into the dummy gate structures 108A and 108B.

The patterning process includes forming a patterned hard mask layer (not shown) over the material for the dummy gate electrode layer 112 to overlap the channel regions of the fin structures 104A and 104B, in accordance with some embodiments. The material for the dummy gate electrode layer 112 and the dielectric material, uncovered by the patterned hard mask layer, is etched away until the source/drain regions of the fin structures 104A and 104B are exposed, in accordance with some embodiments.

Gate spacer layers 114 are formed along the sidewalls of the dummy gate structures 108A and 108B, as shown in FIG. 2B, in accordance with some embodiments. The gate spacer layers 114 are used to offset the subsequently formed source/ drain features and separate the source/drain features from the gate structure, in accordance with some embodiments. In some embodiments, the gate spacer layers 114 are made of dielectric material, such as silicon oxide (SiO$_2$), silicon nitride (SiN), silicon carbide (SiC), silicon oxynitride (SiON), silicon carbon nitride (SiCN), silicon oxycarbonitride (SiOCN), and/or oxygen-doped silicon carbonitride (Si(O)CN).

In some embodiments, the formation of the gate spacer layers 114 includes globally and conformally depositing a dielectric material for the gate spacer layers 114 over the semiconductor structure, followed by an anisotropic etching process. In some embodiments, the etching process is performed without an additional photolithography process. The portions of the dielectric material that remain on the sidewalls of the dummy gate structures 108A and 108B serve as the gate spacer layers 114, in accordance with some embodiments.

Source/drain features 116 are formed over the source/drain regions of the fin structures 104A and 104B, as shown in FIGS. 2B-3 and 2B-4, in accordance with some embodiments. The formation of the source/drain features 116 includes recessing the source/drain regions of the fin structures 104A and 104B using the dummy gate structures 108A and 108B and the gate spacer layers 114 as masks to form source/drain recesses on opposite sides of the dummy gate structures 108A and 108B, in accordance with some embodiments. The source/drain recesses extend into the isolation structure 106, in accordance with some embodiments.

Afterward, the source/drain features 116 are grown on the exposed surfaces of the fin structures 104A and 104B in the source/drain recesses using an epitaxial growth process, in accordance with some embodiments. The epitaxial growth process may be molecular beam epitaxy (MBE), metal organic chemical vapor deposition (MOCVD), or vapor phase epitaxy (VPE), or another suitable technique. In some embodiments, the source/drain features 116 are made of any suitable material for an n-type semiconductor device and a p-type semiconductor device, such as Ge, Si, GaAs, AlGaAs, SiGe, GaAsP, SiP, SiC, SiCP, or a combination thereof. In some embodiments, the source/drain features 116 are in-situ doped during the epitaxial growth process.

For example, the n-type source/drain features for n-type semiconductor devices are doped with the n-type dopant during the epitaxial growth process. For example, the n-type dopant may be phosphorous (P) or arsenic (As). For example, the n-type source/drain features may be the epitaxially grown S1 doped with phosphorous to form silicon:phosphor (Si:P) source/drain features and/or arsenic to form silicon:arsenic (Si:As) source/drain feature. For example, the p-type source/drain features for p-type semiconductor devices are doped with the p-type dopant during the epitaxial growth process. For example, the p-type dopant may be boron (B) or BF$_2$. For example, the p-type source/drain features may be the epitaxially grown SiGe doped with boron (B) to form silicon germanium:boron (SiGe:B) source/drain feature.

A contact etching stop layer 118 is formed over the semiconductor structure 100 to covers the source/drain features 116, as shown in FIGS. 2B-3 and 2B-4, in accordance with some embodiments. In some embodiments, the contact etching stop layer 118 extends along and cover the top surface of the isolation structure 106 and the sidewalls of the gate spacer layers 114. In some embodiments, the contact etching stop layer 118 is made of dielectric material, such as silicon oxide (SiO$_2$), silicon nitride (SiN), silicon oxynitride (SiON), silicon carbide (SiC), oxygen-doped silicon carbide (SiC:O), oxygen-doped silicon carbonitride (Si(O)CN), or a combination thereof. In some embodiments, a dielectric material for the contact etching stop layer 118 is globally and conformally deposited using CVD (such as LPCVD, PECVD, HDP-CVD, or HARP), ALD, another suitable method, or a combination thereof.

An interlayer dielectric layer 120 is formed over the contact etching stop layer 118, as shown in FIGS. 2B-3 and 2B-4, in accordance with some embodiments. In some embodiments, the interlayer dielectric layer 120 is made of dielectric material, such as un-doped silicate glass (USG), or doped silicon oxide such as borophosphosilicate glass (BPSG), fluoride-doped silicate glass (FSG), phosphosilicate glass (PSG), borosilicate glass (BSG), and/or another suitable dielectric material. In some embodiments, the interlayer dielectric layer 120 and the contact etching stop layer 118 are made of different materials and have a great difference in etching selectivity.

In some embodiments, the dielectric material for the interlayer dielectric layer 120 is deposited using such as CVD (such as HDP-CVD, PECVD, HARP or FCVD), another suitable technique, and/or a combination thereof. The dielectric materials for the contact etching stop layer 118 and the interlayer dielectric layer 120 above the upper surface of the dummy gate structures 108A and 108B are removed using such as CMP, in accordance with some embodiments.

Figure 2C:
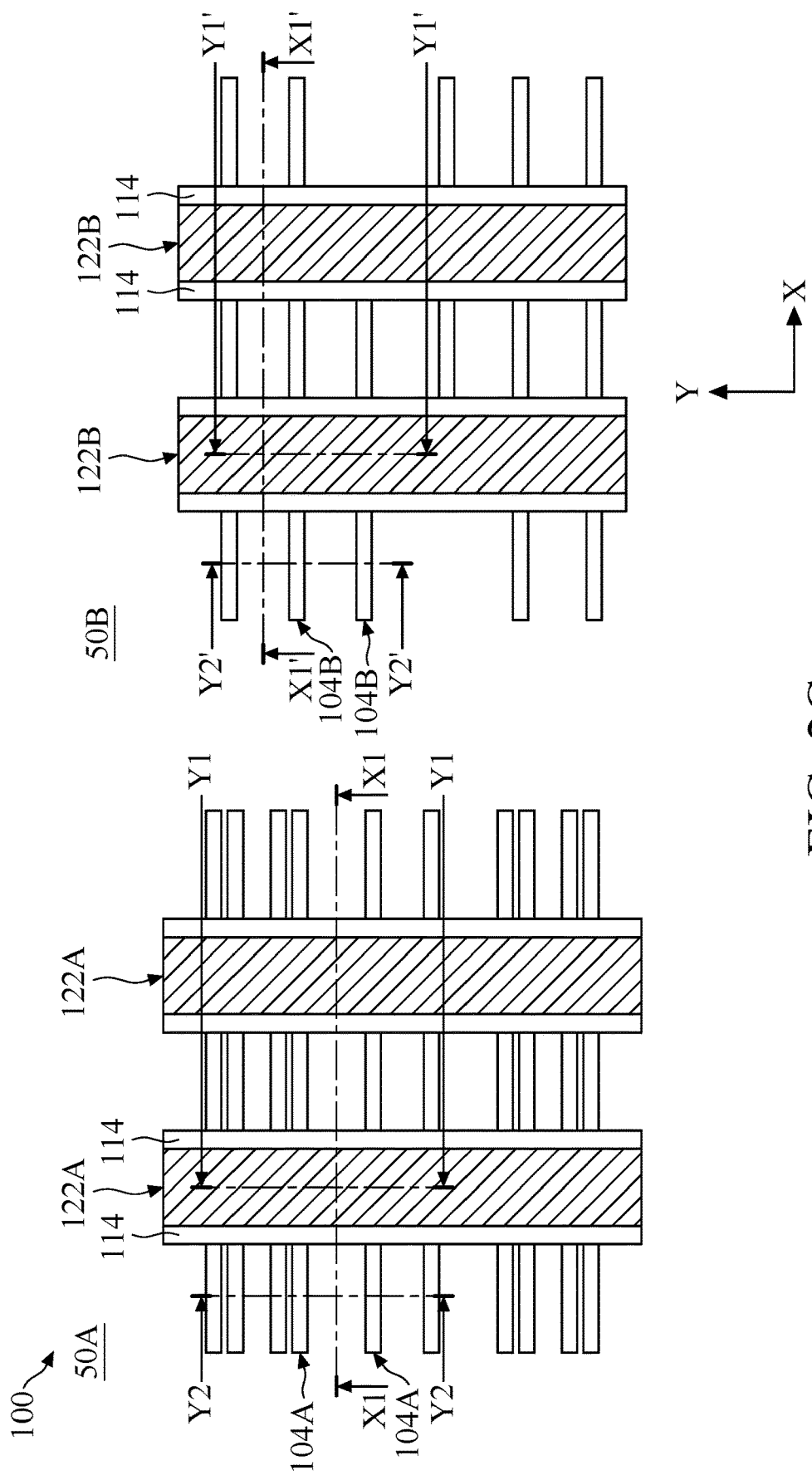
Figures 1, 2, 2C:
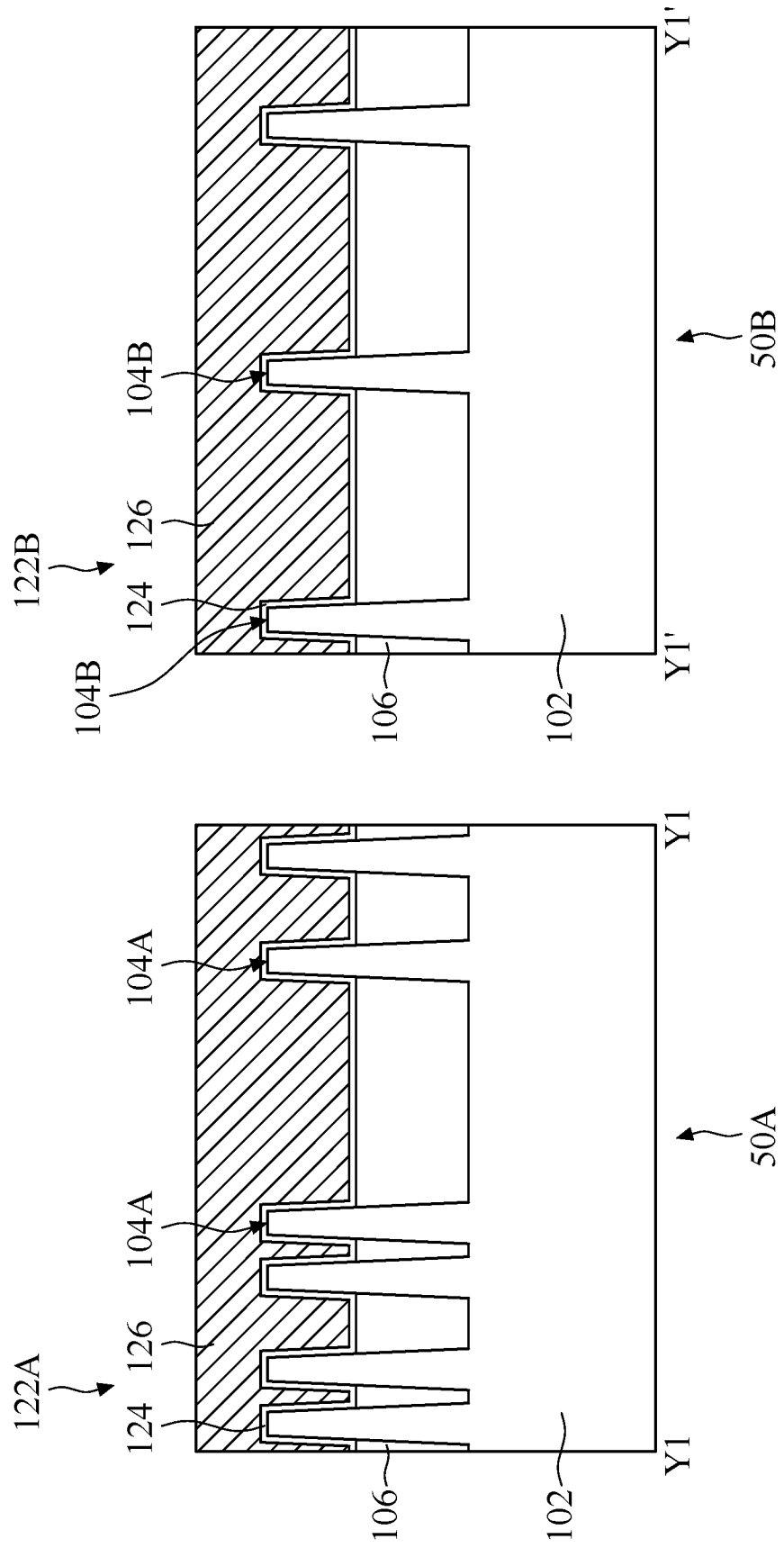
Figures 2, 2C, 3, 4:
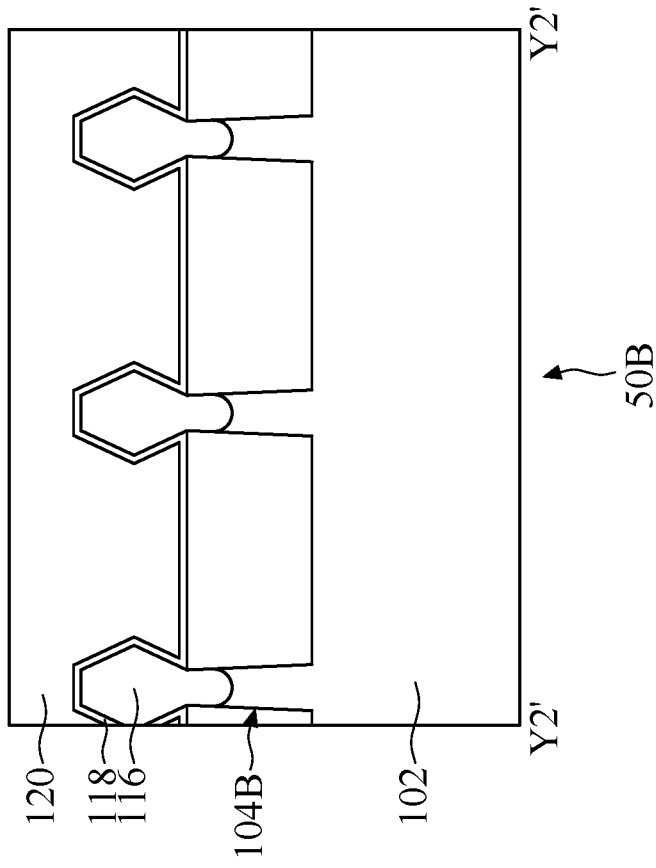
Figures 2, 2C, 3:
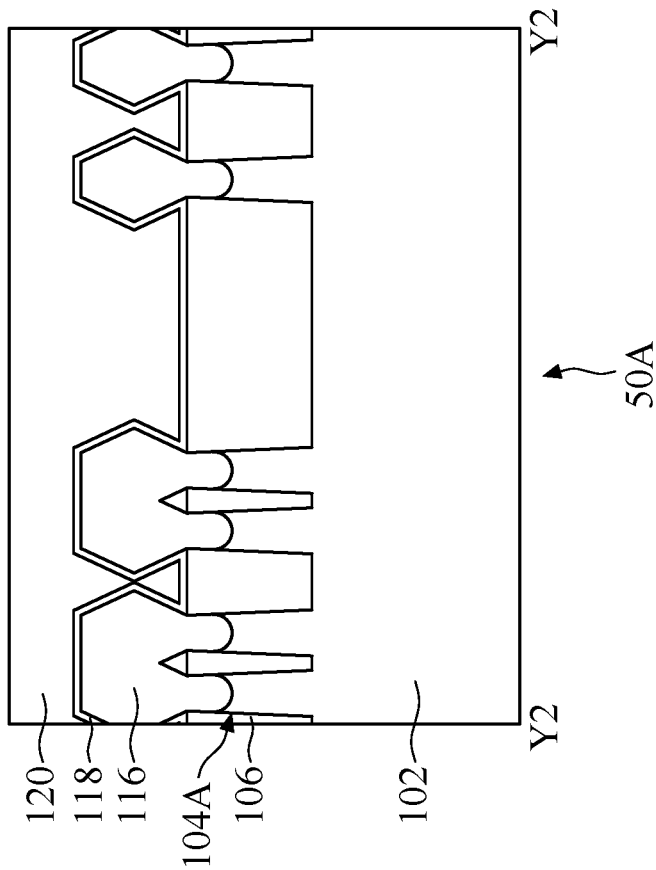
Figure 2D:
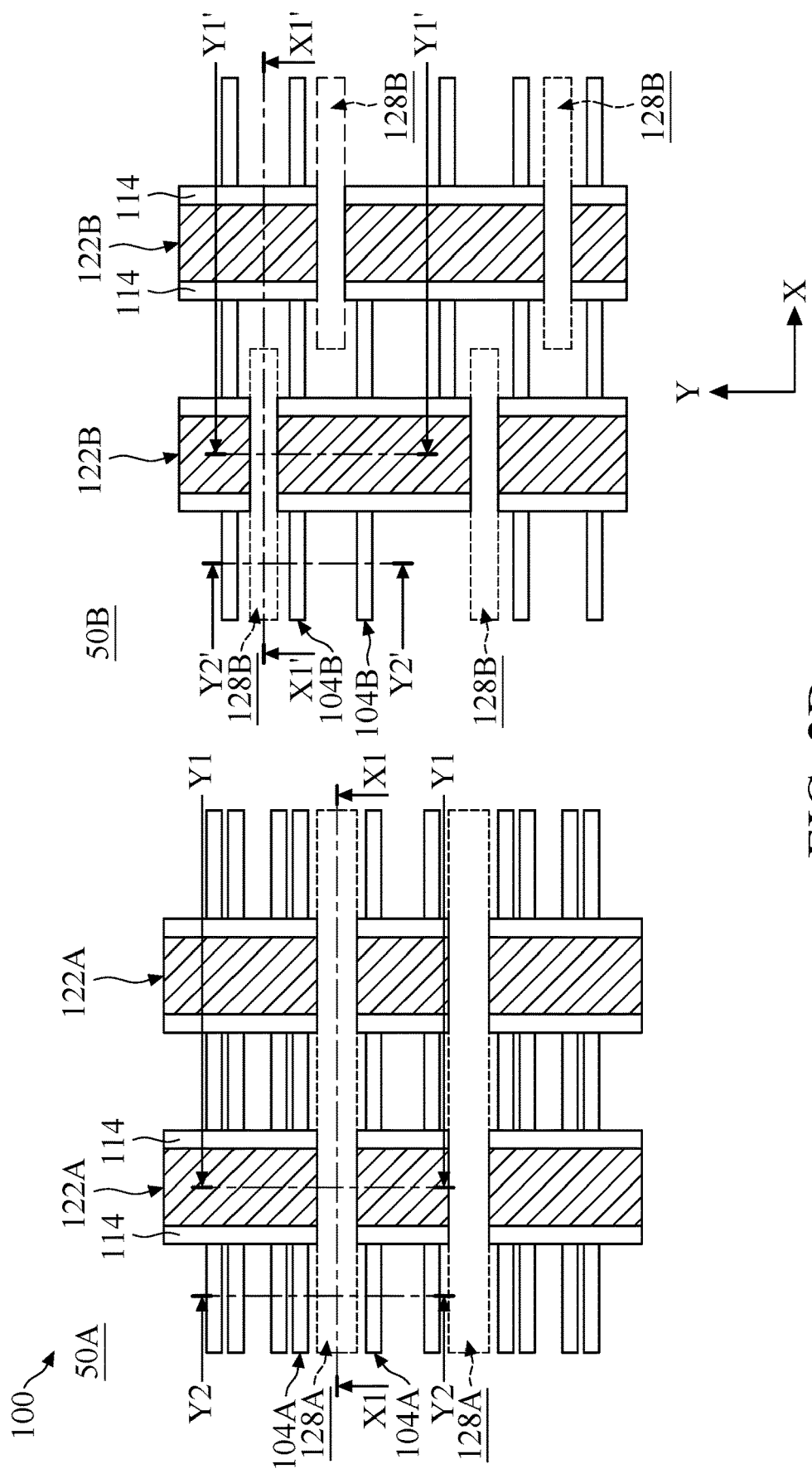
Figures 1, 2, 2D:
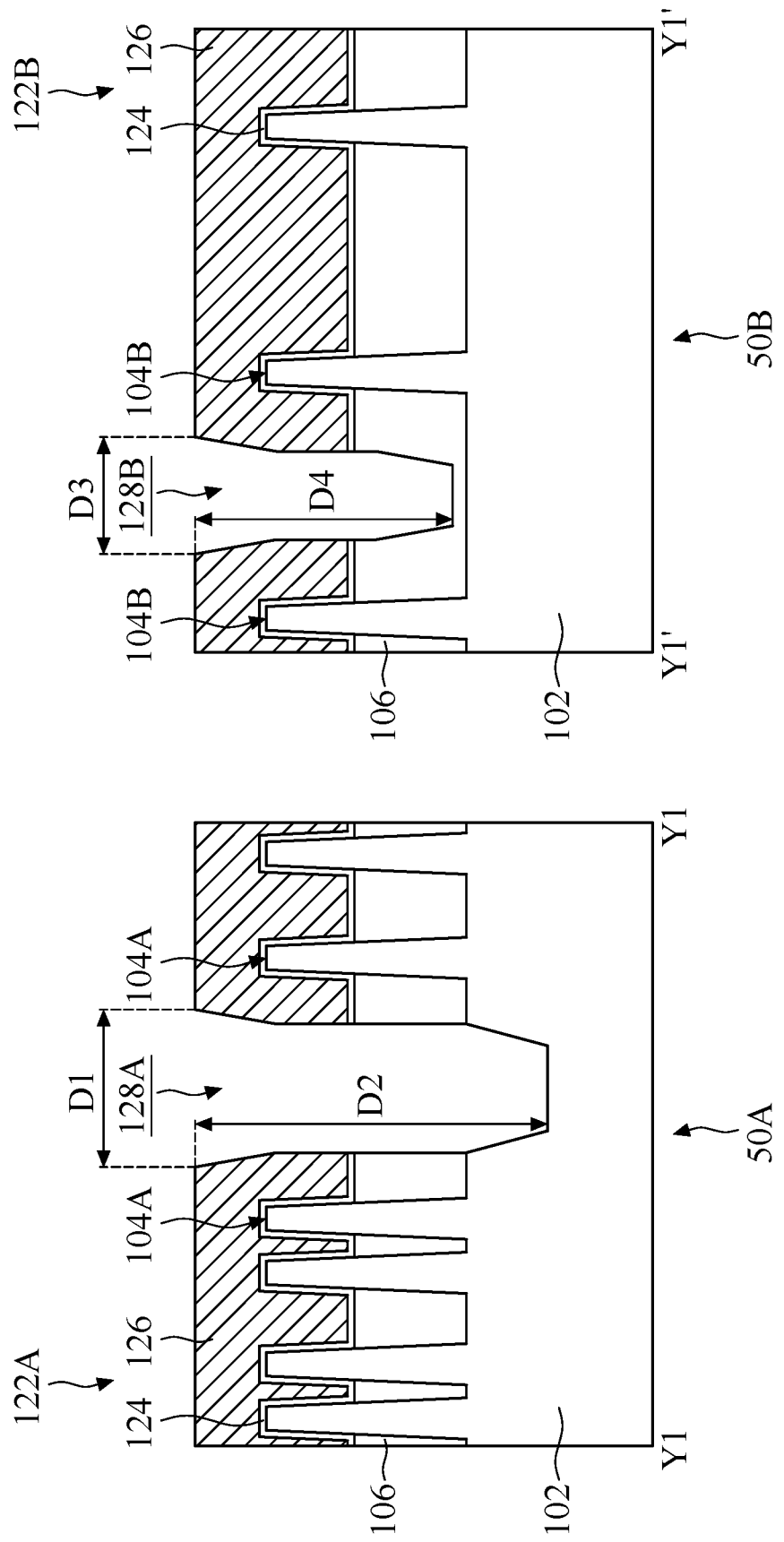
Figure 2E:
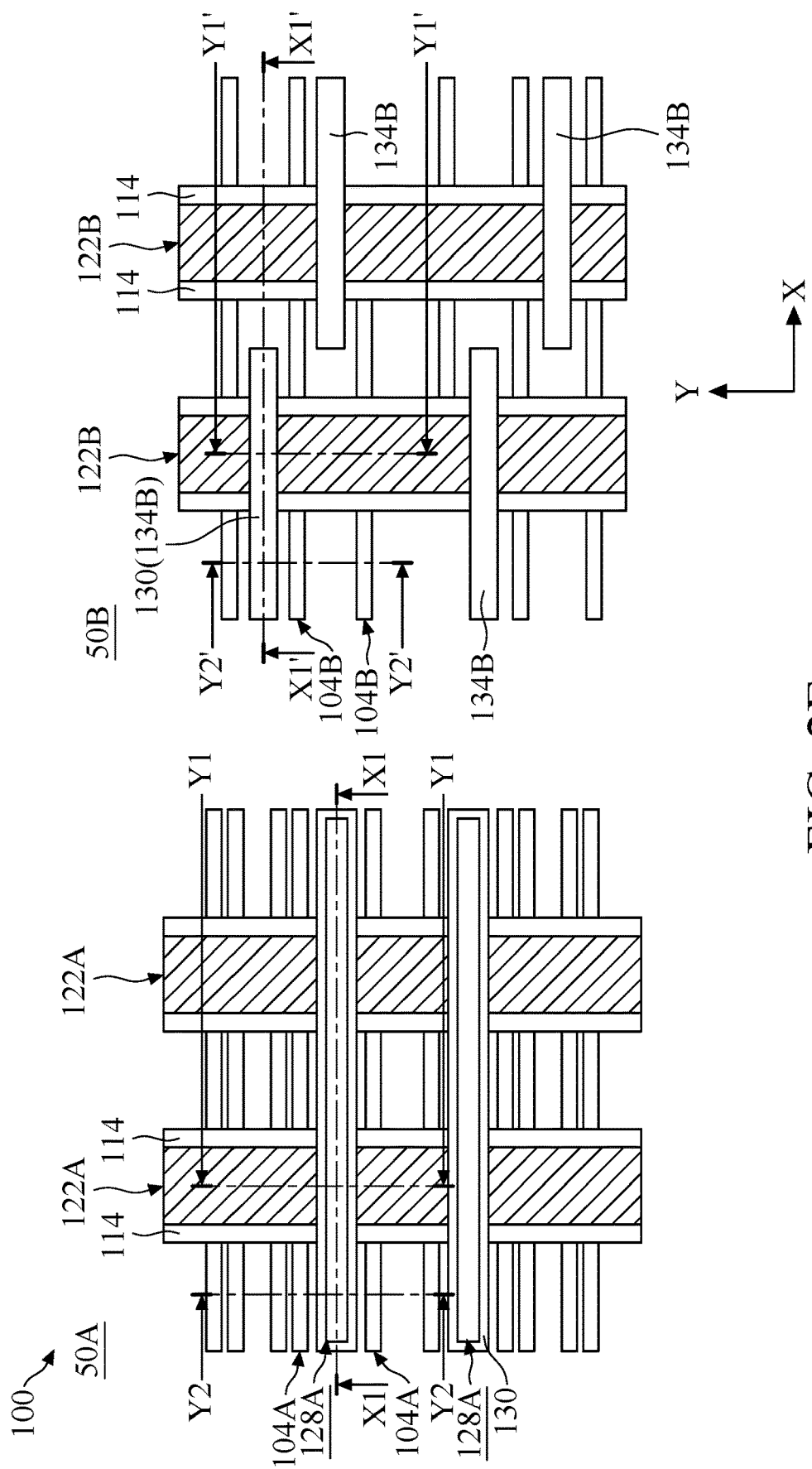
Figures 2, 2E, 3, 4:
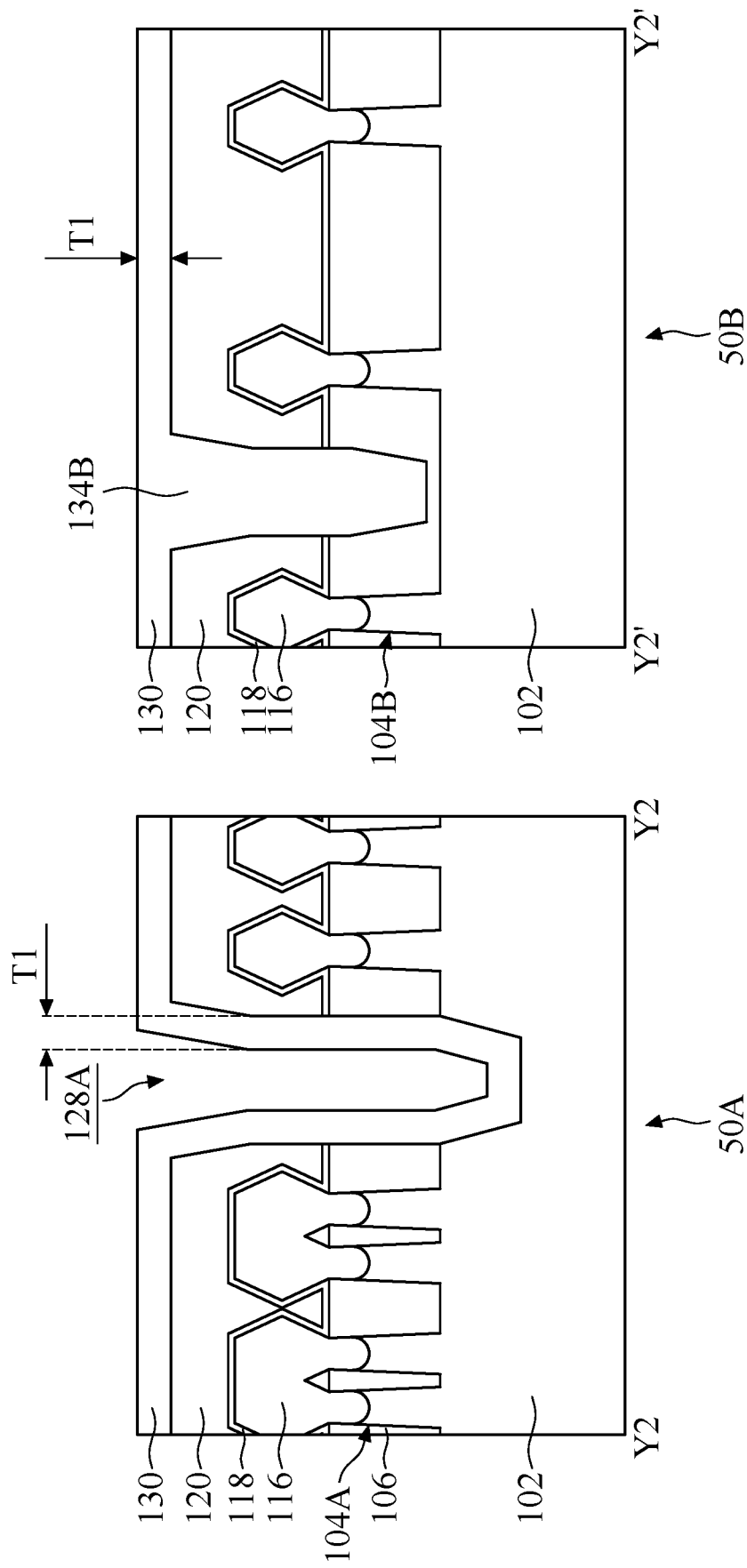
Figure 2F:
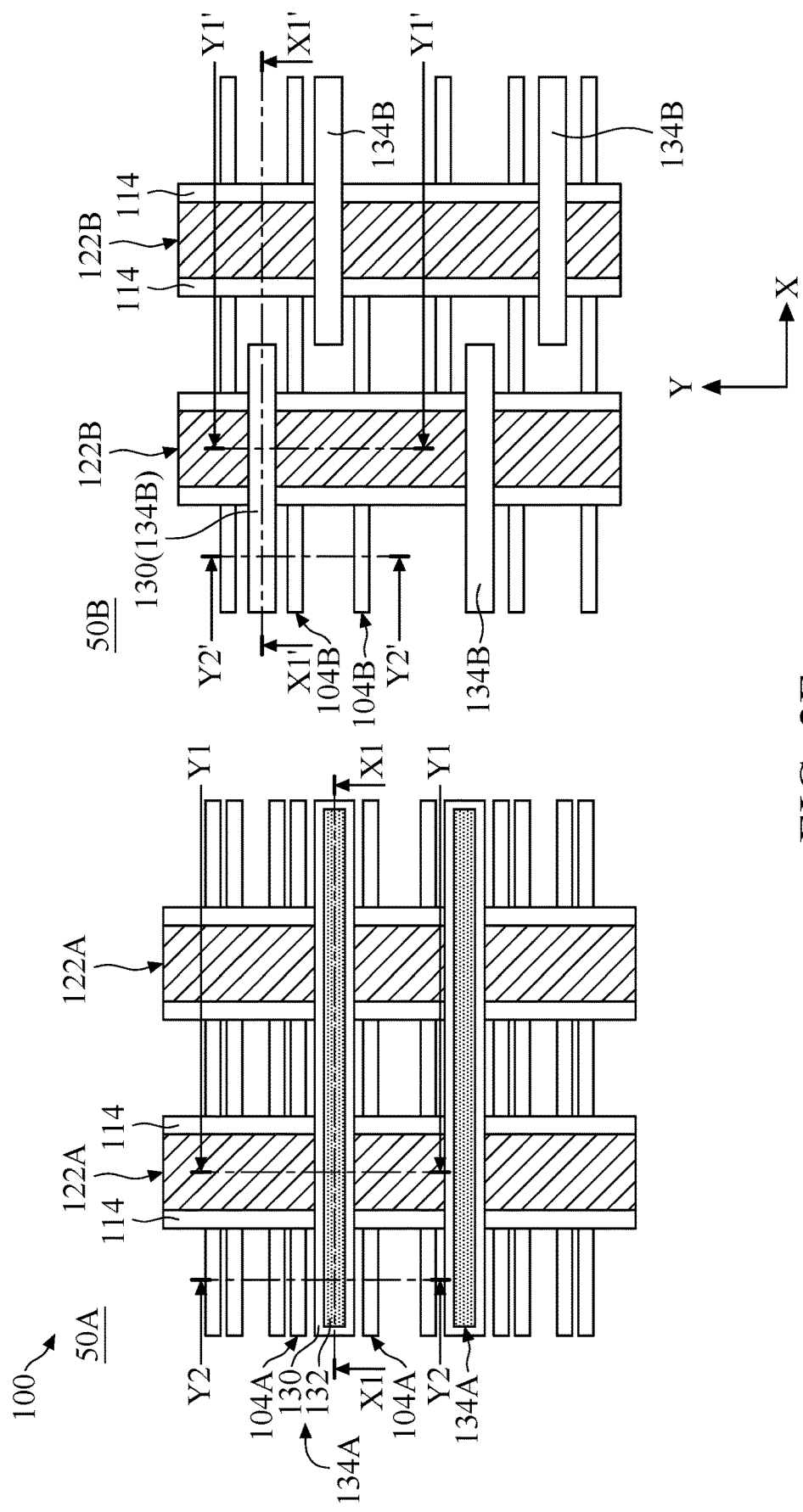
Figures 2, 2F, 3, 4:
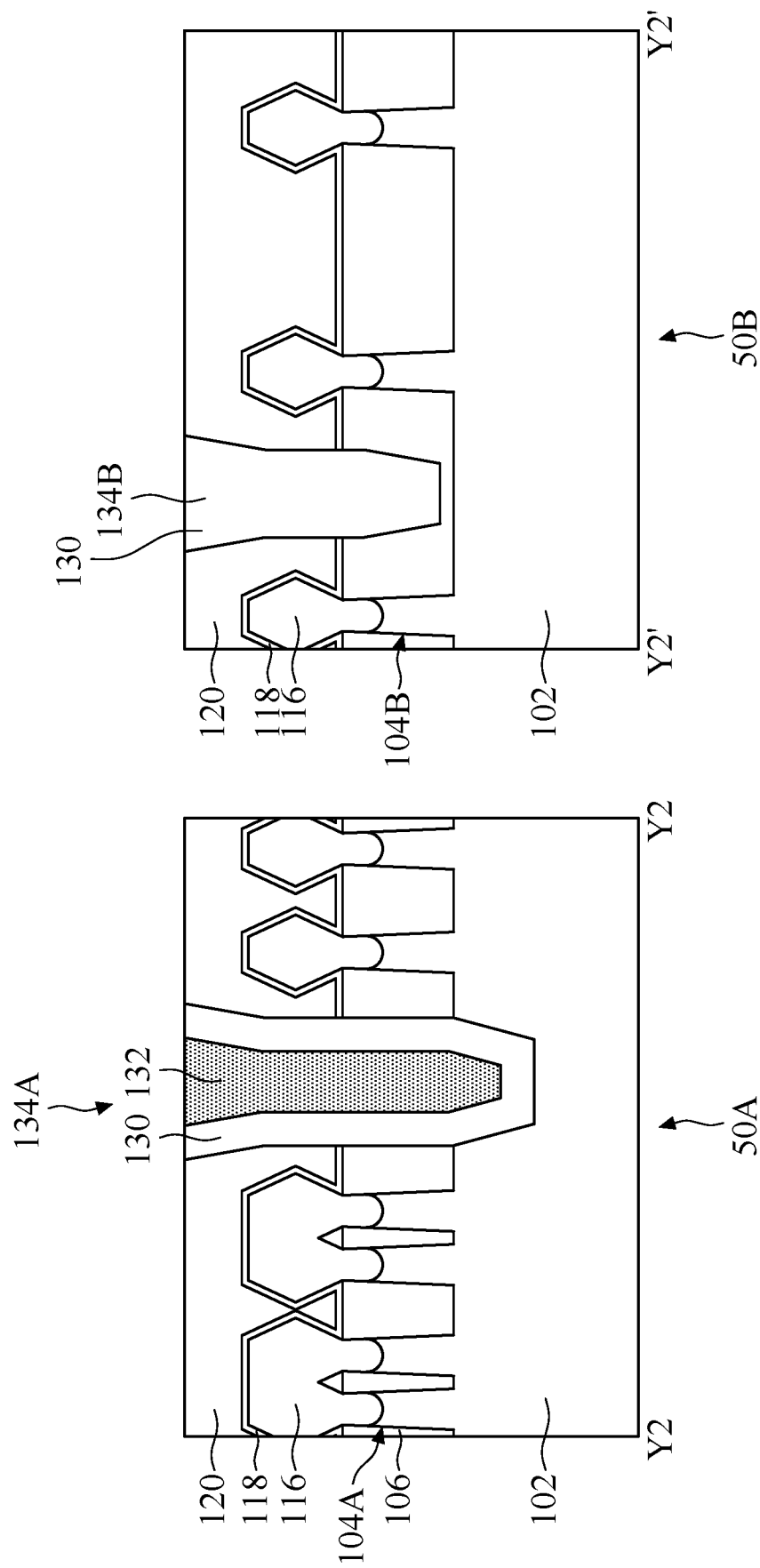
Figures 2, 2F, 3, 4, 5, 6:
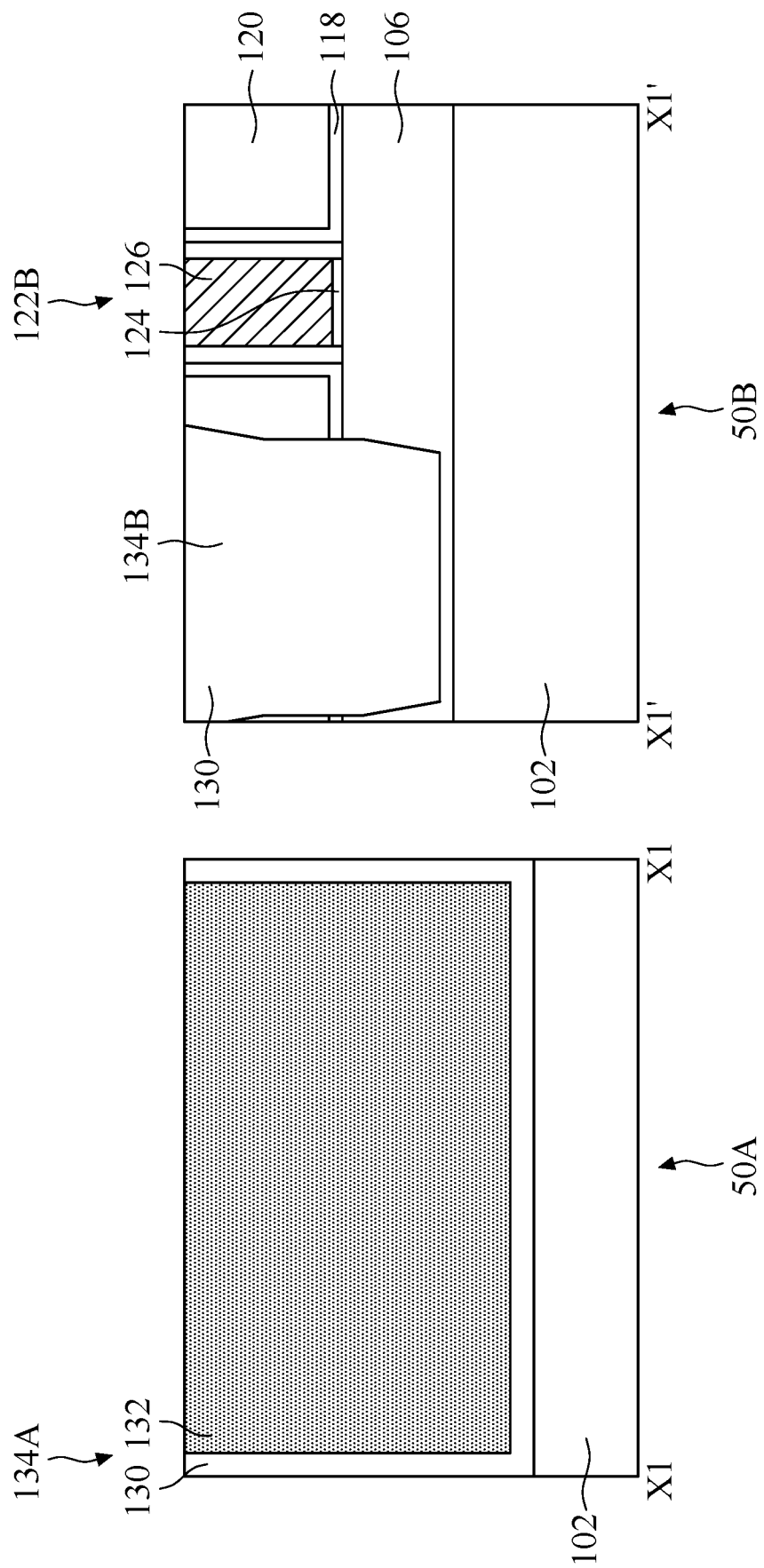

FIGS. 2C through 2C-6 illustrate a semiconductor structure 100 after the formation of final gate stacks 122A and final gate stacks 122B, in accordance with some embodiments. FIGS. 2C-1, 2C-2, 2C-3, 2C-4, 2C-5 and 2C-6 are cross-sectional views of the semiconductor structure 100 taken along line Y1-Y1, line Y1'-Y1', line Y2-Y2, line Y2'-Y2', line X1-X1 and line X1'-X1' of FIG. 2C, respectively.

The dummy gate structures 108A and 108B are removed using one or more etching processes to form gate trenches, in accordance with some embodiments. The gate trenches expose the channel regions of the fin structures 104A and 104B, in accordance with some embodiments. In some embodiments, the gate trenches also expose the inner sidewalls of the gate spacer layers 114 facing the channel region, in accordance with some embodiments. In some embodiments, the etching process includes one or more etching processes. For example, when the dummy gate electrode layer 112 is made of polysilicon, a wet etchant such as a tetramethylammonium hydroxide (TMAH) solution may be used to selectively remove the dummy gate electrode layer 112. For example, the dummy gate dielectric layer 110 may be thereafter removed using a plasma dry etching, a dry chemical etching, and/or a wet etching.

Final gate stacks 122A and 122B are formed in the gate trenches, as shown in FIGS. 2C, 2C-1, 2C-2, 2C-5 and 2C-6, in accordance with some embodiments. The final gate stacks 122A are formed in the logic region 50A and extend across and surround the channel regions of the fin structures 104A, in accordance with some embodiments. The final gate stacks 122B are formed in the memory cell array region 50B and extend across and surround the channel regions of the fin structures 104B, in accordance with some embodiments. In some embodiments, the final gate stacks 122A and 122B extend in the Y direction. The final gate stacks 122A and 122B have longitudinal axes parallel to the Y direction, in accordance with some embodiments. That is, the dimensions (lengths) of the final gate stacks 122A and 122B in the Y direction are greater than the dimensions (widths) of the final gate stacks 122A and 122B in the X direction.

In some embodiments, each of the final gate stacks 122A and 122B includes a gate dielectric layer 124 and a gate electrode layer 126 formed over the gate dielectric layer 124, as shown in FIGS. 2C-1, 2C-2, 2C-5 and 2C-6, in accordance with some embodiments. The gate dielectric layer 124 is formed to partially fill the gate trenches, in accordance with some embodiments. In some embodiments, the gate dielectric layer 124 may include an interfacial layer and a high-k dielectric layer formed over the interfacial layer. The interfacial layer may be made of a chemically formed silicon oxide by one or more cleaning processes such as including ozone ($O_3$), ammonia hydroxide-hydrogen peroxide-water mixture, and/or hydrochloric acid-hydrogen peroxide-water mixture.

In some embodiments, the high-k dielectric layer is made of dielectric material with high dielectric constant (k value), for example, greater than 3.9. In some embodiments, the high-k dielectric layer includes hafnium oxide ($HfO_2$), $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), a combination thereof, or another suitable material. The high-k dielectric layer may be deposited using ALD, PVD, CVD, and/or another suitable technique.

The metal gate electrode layer 126 is formed to fill remainders of the gate trenches, in accordance with some embodiments. In some embodiments, the metal gate electrode layer 126 is made of more than one conductive material, such as a metal, metal alloy, conductive metal oxide and/or metal nitride, another suitable conductive material, and/or a combination thereof. For example, the metal gate electrode layer 126 may be made of Ti, Ag, Al, TiAlN, TaC, TaCN, TaSiN, Mn, Zr, TiN, TaN, Ru, Mo, WN, Cu, W, Re, Ir, Co, Ni, another suitable conductive material, or multilayers thereof.

The metal gate electrode layer 126 may be a multi-layer structure with various combinations of a diffusion barrier layer, work function layers with a selected work function to enhance the device performance (e.g., threshold voltage) for n-channel FETs or p-channel FETs, a capping layer to prevent oxidation of work function layers, a glue layer to adhere work function layers to a next layer, and a metal fill layer to reduce the total resistance of gate stacks, and/or another suitable layer. The metal gate electrode layer 126 may be formed using ALD, PVD, CVD, e-beam evaporation, or another suitable technique. The metal gate electrode layer 126 may be formed separately for n-channel FinFETs and p-channel FinFETs, which may use different work function materials.

A planarization process such as CMP may be performed on the semiconductor structure to remove the materials of the gate dielectric layer 124 and the metal gate electrode layer 126 formed above the top surface of the interlayer dielectric layer 120, in accordance with some embodiments. After the planarization process, the top surfaces of the metal gate electrode layer 126, the gate spacer layers 114, the contact etching stop layer 118 and the interlayer dielectric layer 120 are substantially coplanar, in accordance with some embodiments.

In the logic region 50A, portions of the final gate stacks 122A surrounding the fin structures 104A combine with the neighboring source/drain features 116 to form FinFETs (e.g., p-channel FinFETs or n-channel FinFETs), in accordance with some embodiments. The final gate stacks 122A engage the channel so that current can flow between the source/drain features 116 during operation. In the memory cell array region 50B, portions of the final gate stacks 122B surrounding the fin structures 104B combine with the neighboring source/drain features 116 to form FinFETs (e.g., p-channel FinFETs or n-channel FinFETs), in accordance with some embodiments. The final gate stacks 122B engage the channel so that current can flow between the source/drain features 116 during operation.

FIGS. 2D through 2D-6 illustrate a semiconductor structure 100 after the formation of gate cutting trenches 128A and gate cutting trenches 128B, in accordance with some embodiments. FIGS. 2D-1, 2D-2, 2D-3, 2D-4, 2D-5 and 2D-6 are cross-sectional views of the semiconductor structure taken along line Y1-Y1, line Y1'-Y1', line Y2-Y2, line Y2'-Y2', line X1-X1 and line X1'-X1' of FIG. 2D, respectively.

A cutting process is performed on the final gate stacks 122A and 122B, as shown in FIGS. 2D, 2D-1 and 2D-2, in accordance with some embodiments. The cutting process includes patterning the semiconductor structure 100 to form gate cutting trenches 128A and 128B, as shown in FIGS. 2D, 2D-1, 2D-2, 2D-3, 2D-4, 2D-5 and 2D-6, in accordance with some embodiments. The final gate stacks 122A are cut into several segments by the gate cutting trenches 128A, in accordance with some embodiments. The final gate stacks 122B are cut into several segments by the gate cutting trenches 128B, in accordance with some embodiments. The gate cutting trenches may be also referred to as cut metal gate (CMG) pattern.

The gate cutting trenches 128A are formed in the spacing S1 (FIG. 2A) in the logic region 50A, and the gate cutting trenches 128B are formed in the spacing S2 (FIG. 2B) in the memory cell array region 50B, in accordance with some embodiments. In some embodiments, the gate cutting trenches 128A and 128B extend in the X direction. The gate cutting trenches 128A and 128B have longitudinal axes parallel to the X direction, in accordance with some embodiments. That is, the dimensions (lengths) of the gate cutting trenches 128A and 128B in the X direction are greater than the dimensions (widths) of the gate cutting trenches 128A and 128B in the Y direction.

The cutting process includes forming a patterned mask layer over the semiconductor structure 100 using a photolithography process. The patterned mask layer has trench patterns corresponding to the gate cutting trenches 128A and 128B, in accordance with some embodiments. One or more etching process are then performed using the patterned mask layer to remove portions of the final gate stacks 122A and 122B, the gate spacer layers 114, the contact etching stop layer 118, the interlayer dielectric layer 120, the isolation structure 106 and the substrate 102 exposed from the trench patterns, in accordance with some embodiments. The one or more etching processes may include dry etching such as reactive ion etch (RIE), neutral beam etch (NBE), inductive coupled plasma (ICP) etch, capacitively coupled plasma (CCP) etch, another suitable method, or a combination thereof.

During the one or more etching processes, the source/drain features 116 are kept at a distance from the gate cutting trenches 128A and 128B to avoid damage to the source/drain features 116, as shown in FIGS. 2D-3 and 2D-4, in accordance with some embodiments. Because the spacing S1 (FIGS. 2A and 2A-1) where the gate cutting trenches 128A are formed is greater than the spacing S2 (FIGS. 2A and 2A-2) where the gate cutting trenches 128B, the trench patterns for the gate cutting trenches 128A are defined to be wider (in the Y direction) than the gate cutting trench patterns for trenches 128B without causing the damage to the source/drain features 116 in the logic region 50A, in accordance with some embodiments.

In some embodiments, the gate cutting trenches 128A have a dimension D1 in the Y direction measured at the top of the metal gate electrode layer 126. In some embodiments, the dimension D1 is in a range from about 15 nm to about 90 nm. In some embodiments, the gate cutting trenches 128B have a dimension D3 in the Y direction measured at the top of the metal gate electrode layer 126. In some embodiments, the dimension D3 is in a range from about 7.5 nm to about 25 nm. In some embodiments, the dimension D1 is greater than the dimension D3. In some embodiments, the ratio (D3/D1) of the dimension D3 to the dimension D1 is in a range from about 0.3 to about 0.8, e.g., about 0.4 to about 0.6.

In some embodiments, the gate cutting trenches 128A have a depth D2 in the Z direction. In some embodiments, the gate cutting trenches 128B have a depth D4 in the Z direction. Because the dimension D1 of the gate cutting trenches 128A is greater than the dimension D3 of the gate cutting trenches 128B, more vertical etching occurs in the logic region 50A than in the memory cell array region 50B. As a result, in some embodiments, the depth D2 is greater than the depth D4. In some embodiments, the ratio (D4/D2) of the depth D4 to the depth D2 is in a range from about 0.6 to about 0.95. When the one or more etching process is complete, the bottom surfaces of the gate cutting trenches 128A stop inside the substrate 102, while the bottom surfaces of the gate cutting trenches 128B stop inside the isolation structure 106, in accordance with some embodiments.

FIGS. 2E through 2E-6 illustrate a semiconductor structure 100 after the formation of a first dielectric material 130, in accordance with some embodiments. FIGS. 2E-1, 2E-2, 2E-3, 2E-4, 2E-5 and 2E-6 are cross-sectional views of the semiconductor structure taken along line Y1-Y1, line Y1'-Y1', line Y2-Y2, line Y2'-Y2', line X1-X1 and line X1'-X1' of FIG. 2E, respectively.

The first dielectric material 130 is formed over the semiconductor structure 100 to fill the gate cutting trenches 128A and 128B, as shown in FIGS. 2E, 2E-1, 2E-2, 2E-3, 2E-4, 2E-5 and 2E-6, in accordance with some embodiments. The gate cutting trenches 128B are overfilled with the first dielectric material 130, while the gate cutting trenches 128A are partially filled with the first dielectric material 130, in accordance with some embodiments. The portions of the first dielectric material 130 in the gate cutting trenches 128B serve as gate cutting structures 134B, in accordance with some embodiments.

In some embodiments, the first dielectric material 130 is silicon nitride (SiN), silicon oxynitride (SiON), silicon carbon nitride (SiCN), silicon oxide ($SiO_2$), silicon oxycarbonitride (SiOCN), oxygen-doped silicon carbide (SiC:O), oxygen-doped silicon carbonitride (Si(O)CN), or a combination thereof. In some embodiments, the first dielectric material 130 is deposited using ALD, CVD such as LPCVD, PECVD, HDP-CVD, or HARP, another suitable technique, or a combination thereof. In some embodiments, the first dielectric material 130 is deposited with a thickness T1 along the sidewalls of the fin structure 104A (measured in the Y direction), and over the top surface of the metal gate electrode layer 126, in accordance with some embodiments. In some embodiments, the thickness T1 is in a range from 3.8 nm to about 22.5 nm.

During the deposition process, in the trench 128B, a first portion of the dielectric material 130 formed on a sidewall of the trench 128B and a second portion of the dielectric material 130 formed on another sidewall of the trench 128B gradually approach each other, in accordance with some embodiments. The deposition process is performed until the first portion and the second portion of the dielectric material 130 entirely merged, in accordance with some embodiments. In the trench 128A, when the deposition process is complete, a third portion of the dielectric material 130 formed on a sidewall of the trench 128A has not yet merged with a fourth portion of the dielectric material 130 formed on another sidewall of the trench 128A, because the dimension D1 (FIG. 2D-1) of the gate cutting trenches 128A is greater than the dimension D3 (FIG. 2D-2) of the gate cutting trenches 128B, in accordance with some embodiments.

FIGS. 2F through 2F-6 illustrate a semiconductor structure 100 after the formation of a second dielectric material 132, in accordance with some embodiments. FIGS. 2F-1, 2F-2, 2F-3, 2F-4, 2F-5 and 2F-6 are cross-sectional views of the semiconductor structure taken along line Y1-Y1, line Y1'-Y1', line Y2-Y2, line Y2'-Y2', line X1-X1 and line X1'-X1' of FIG. 2F, respectively.

The second dielectric material 132 is formed over the semiconductor structure 100 to overfill the remainders of the gate cutting trenches 128A, as shown in FIGS. 2F, 2F-1, 2F-3 and 2F-5, in accordance with some embodiments. The portions of the first dielectric material 130 and the second dielectric material 132 that are in the gate cutting trenches 128A serve as gate cutting structures 134A, in accordance with some embodiments. In some embodiments, the second dielectric material 132 is silicon oxide ($SiO_2$), silicon oxycarbonitride (SiOCN), oxygen-doped silicon carbide (SiC:O), oxygen-doped silicon carbonitride (Si(O)CN), silicon carbon nitride (SiCN), silicon oxynitride (SiON), silicon nitride (SiN), or a combination thereof.

In some embodiments, the second dielectric material 132 is deposited using ALD, CVD such as LPCVD, PECVD, HDP-CVD, HARP, or FCVD, another suitable technique, or a combination thereof. In some embodiments, the second dielectric material 132 and the first dielectric material 130 are made of different materials and have a great difference in etching selectivity. In some embodiments, the dielectric constant of the second dielectric material 132 is less than the dielectric constant of the first dielectric material 130. For example, the first dielectric material 130 is SiN and the second dielectric material 132 is SiO, SiON, SiCN or SiOCN. In some embodiments, the second dielectric material 132 has a thickness T2 in the Y direction, in accordance with some embodiments. In some embodiments, the thickness T2 is in a range from 7.5 nm to about 45 nm.

A planarization process is then performed on the semiconductor structure 100 to remove the second dielectric material 132 and the first dielectric material 130 formed above the top surface of the metal gate electrode layer 126, in accordance with some embodiments. The planarization may be CMP, etching back process, or a combination thereof. After the planarization process, the top surfaces of the second dielectric material 132, the first dielectric material 130, the metal gate electrode layer 126, the gate spacer layers 114, the contact etching stop layer 118 and the interlayer dielectric layer 120 are substantially coplanar, in accordance with some embodiments.

The gate cutting structures 134A are formed in the spacing S1 (FIG. 2A) in the logic region 50A, in accordance with some embodiments. The gate cutting structures 134B are formed in the spacing S2 (FIG. 2B) in the memory cell array region 50B, in accordance with some embodiments. In some embodiments, the gate cutting structures 134A and 134B extend in the X direction. The gate cutting structures 134A and 134B have longitudinal axes parallel to the X direction, in accordance with some embodiments. That is, the dimensions (lengths) of the gate cutting structures 134A and 134B in the X direction are greater than the dimensions (widths) of the gate cutting structures 134A and 134B in the Y direction.

The segments of the final gate stacks 122A are physically and electrically insulated from one another by the gate cutting structures 134A, and the segments of the final gate stacks 122B are physically and electrically insulated from one another by the gate cutting structures 134B, in accordance with some embodiments.

In some embodiments, the gate cutting structures 134A are bi-layer structures in which the second dielectric material 132 is nested within the first dielectric material 130. In some embodiments, the gate cutting structures 134B are single-layer structures including the first dielectric material 130 and are free of the second dielectric material 132. In some embodiments, the overall dielectric constant of the gate cutting structures 134A is less than the dielectric constant of the gate cutting structures 134B.

In some embodiments, the gate cutting structures 134A have a dimension D5 in the Y direction measured at the top of the metal gate electrode layer 126. In some embodiments, the dimension D5 is in a range from about 15 nm to about 90 nm. In some embodiments, the gate cutting structures 134B have a dimension D7 in the Y direction measured at the top of the metal gate electrode layer 126. In some embodiments, the dimension D7 is in a range from about 7.5 nm to about 45 nm. In some embodiments, the dimension D5 is greater than the dimension D7. In some embodiments, the ratio (D7/D5) of the dimension D7 to the dimension D5 is in a range from about 0.3 to about 0.8, e.g., from about 0.4 to about 0.6.

In some embodiments, the gate cutting structures 134A have a thickness D6 in the Z direction. In some embodiments, the gate cutting structures 134B have a thickness D8 in the Z direction. In some embodiments, the thickness D6 is greater than the thickness D8. In some embodiments, the ratio (D8/D6) of the thickness D8 to the thickness D6 is in a range from about 0.6 to about 0.95. In some embodiments, the bottom surface of the gate cutting structures 134A is located at a lower position than the bottom surface of the isolation structure 106. In some embodiments, the bottom surface of the gate cutting structures 134B is located at a position between the top surface and the bottom surface of the isolation structure 106.

In some embodiments, the first distance, which is measured from the top of the fin structure 104A to the bottom of the gate cutting structures 134A in the Z direction, is greater than about 140 nm. In some embodiments, the second distance, which is measured from the top of the fin structure 104B to the bottom of the gate cutting structures 134B in the Z direction, is greater than 120 nm. The first distance is greater than the second distance, in accordance with some embodiments.

Figure 2G:
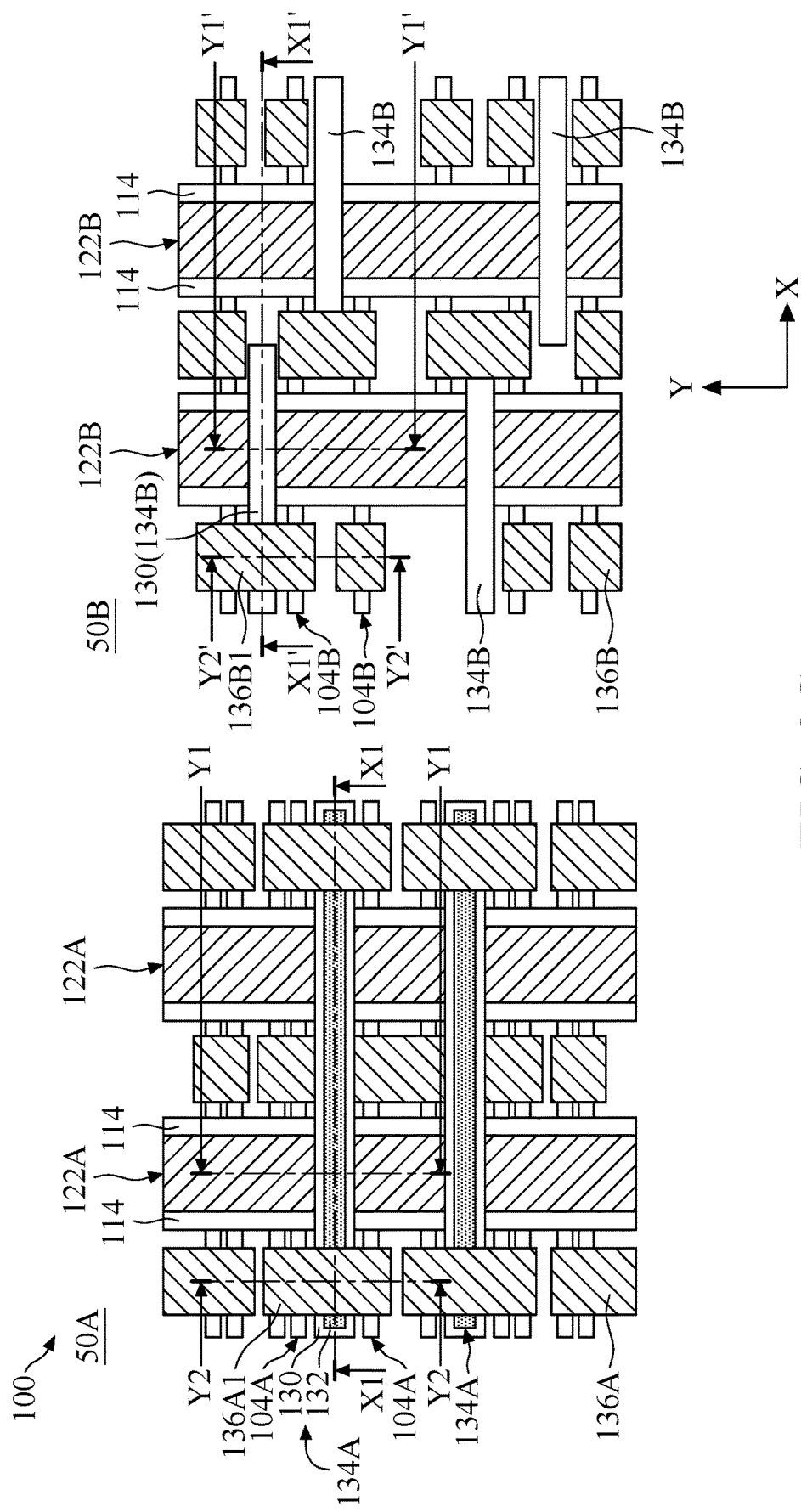
Figures 2, 2G, 3, 4:
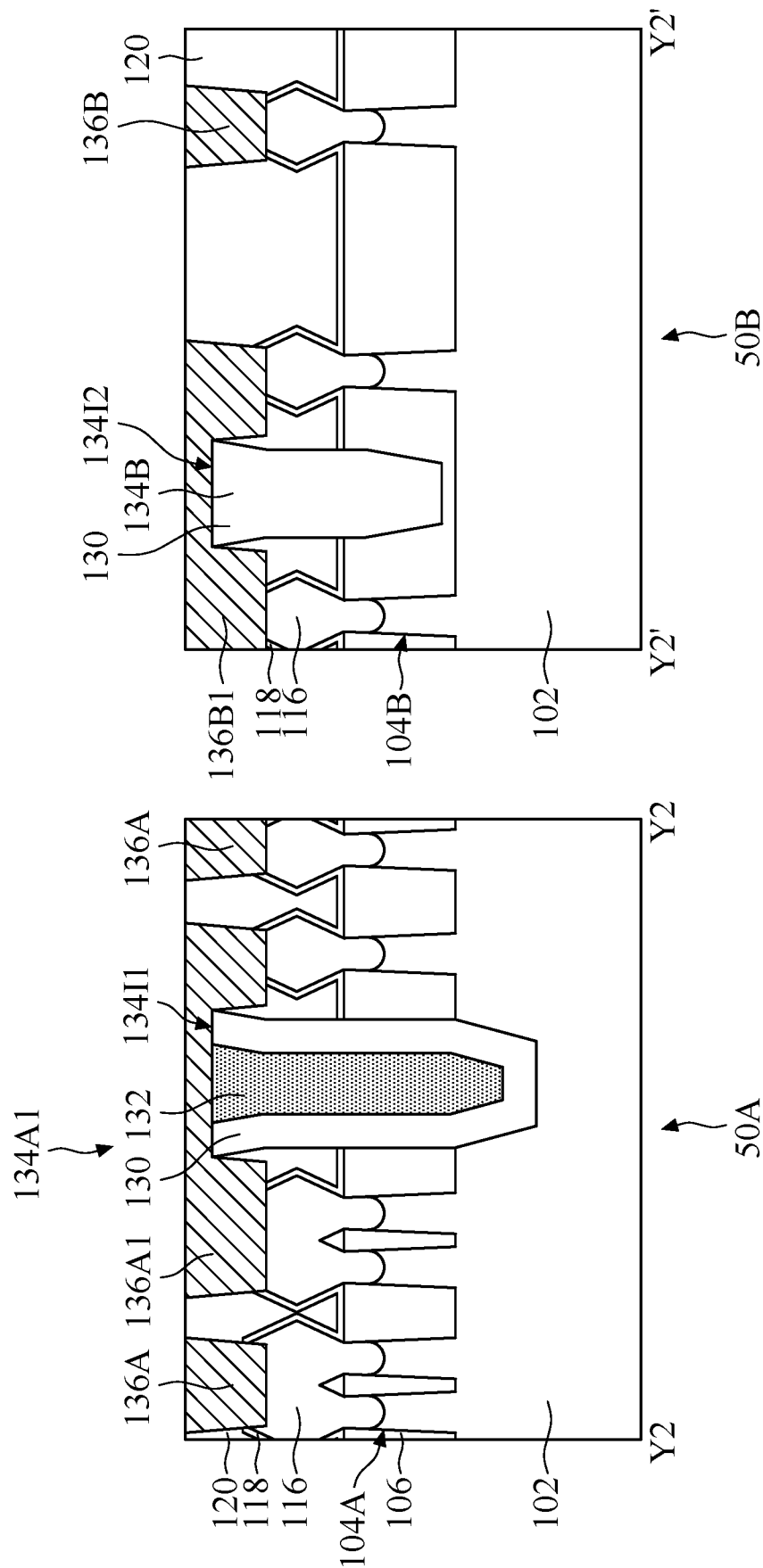
Figures 2, 2G, 3, 4, 5, 6:
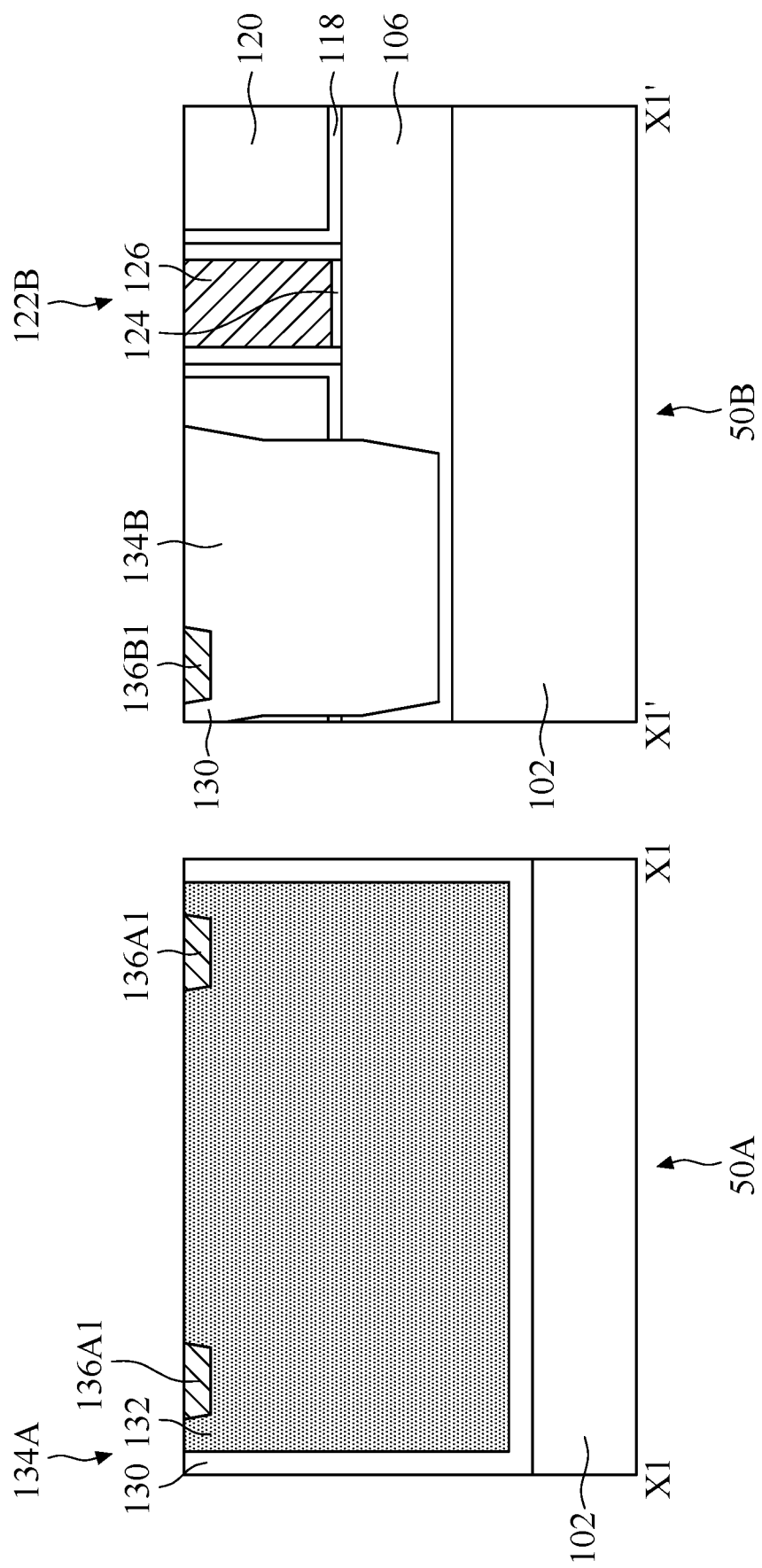
Figures 1, 2, 3:
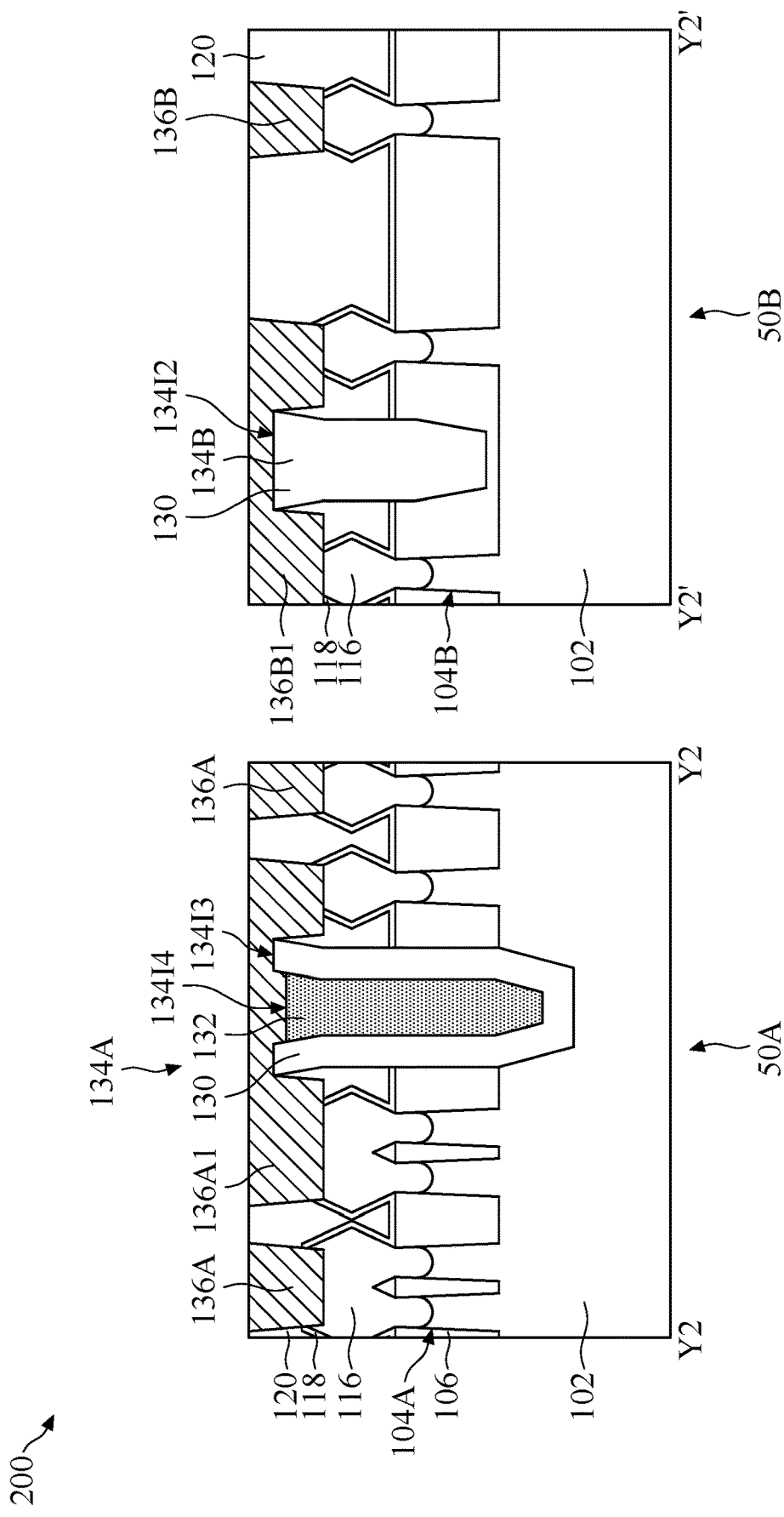

FIGS. 2G through 2G-6 illustrate a semiconductor structure 100 after the formation of contact plugs 136A and contact plugs 136B, in accordance with some embodiments. FIGS. 2G-1, 2G-2, 2G-3, 2G-4, 2G-5 and 2G-6 are cross-sectional views of the semiconductor structure taken along line Y1-Y1, line Y1'-Y1', line Y2-Y2, line Y2'-Y2', line X1-X1 and line X1'-X1' of FIG. 2G, respectively.

Contact plugs 136A and 136B are formed in and/or through the interlayer dielectric layer 120 and the contact etching stop layer 118 and land on and the source/drain features 116, as shown in FIGS. 2G, 2G-3, 2G-4, 2G-5 and 2G-6, in accordance with some embodiments. The contact plugs 136A are formed in the logic region 50A and are electrically connected to the source/drain features 116, in accordance with some embodiments. The contact plugs 136B are formed in the memory cell array region 50B and are electrically connected to the source/drain features 116, in accordance with some embodiments.

In some embodiments, some (labeled with 136A 1) of the contact plugs 136A are formed over and in direct contact with the gate cutting structures 134A. In some embodiments, the contact plug 136A 1 continuously extends over the source/drain features 116 and the gate cutting structure 134A, as shown in FIGS. 2G, 2G-3 and 2G-5. The contact plug 136A1 is also formed in and/or through the gate cutting structure 134A, in accordance with some embodiments. In some embodiments, some (labeled with 136B1) of the contact plugs 136B are formed over and in direct contact with the gate cutting structures 134B. In some embodiments, the contact plug 136B1 continuously extends over the source/drain features 116 and the gate cutting structure 134B, as shown in FIGS. 2G, 2G-4 and 2G-6. The contact plug 136B1 is also formed in and/or through the gate cutting structure 134B, in accordance with some embodiments.

In some embodiments, the formation of the contact plugs 136A and 136B includes patterning the interlayer dielectric layer 120, the contact etching stop layer 118 and the gate cutting structures 134A and 134B to form contact openings (where the contact plugs 136A and 136B are to be formed) using photolithography and etching processes until the source/drain features 116 are exposed. The etching processes may include dry etching such as RIE, NBE, ICP etch, CCP etch, another suitable method, or a combination thereof.

In the etching process for forming the contact openings, the second dielectric material 132 has a better etching resistance than the first dielectric material 130, and thus the loss of the gate cutting structures 134A and 134B caused by the lateral etching may be reduced, in accordance with some embodiments. If the materials of the gate cut structures lose too much, it may cause an increase in parasitic capacitance of the semiconductor devices.

A silicide layer (such as WSi, NiSi, TiSi and/or CoSi) may be formed on the exposed source/drain features 116, and then one or more conductive materials for the contact plugs 136A and 136B are deposited to fill the contact openings, in accordance with some embodiments. In some embodiments, one or more conductive materials are deposited using CVD, PVD, c-beam evaporation, ALD, electroplating (ECP), electroless deposition (ELD), another suitable method, or a combination thereof to overfill the contact openings. Afterward, the one or more conductive materials over the interlayer dielectric layer 120 are planarized using, for example, CMP. After the planarization process, the top surfaces of the contact plugs 136A and 136B, the second dielectric material 132, the first dielectric material 130, the metal gate electrode layer 126, the gate spacer layers 114, the contact etching stop layer 118 and the interlayer dielectric layer 120 are substantially coplanar.

The contact plugs 136A and 136B may have a multilayer structure including, for example, liner layers, glue layers, barrier layers, seed layers, metal bulk layers, another suitable layer, or a combination thereof. For example, a barrier layer (not shown) may optionally be deposited along the sidewalls and the bottom surfaces of the contact openings. The barrier layer is used to prevent the metal from the subsequently formed metal material from diffusing into the dielectric material (e.g., the interlayer dielectric layer 120 and the contact etching stop layer 118). The barrier layer may be made of tantalum (Ta), tantalum nitride (TaN), titanium (Ti), titanium nitride (TiN), cobalt tungsten (CoW), another suitable material, or a combination thereof. If the subsequently formed metal material does not easily diffuse into the dielectric material, the barrier layer may be omitted.

A glue layer (not shown) may optionally be deposited along the sidewalls and the bottom surfaces of the contact openings, and on the barrier layer (if formed). The glue layer is used to improve adhesion between the subsequently formed metal material and the dielectric material (e.g., the interlayer dielectric layer 120 and the contact etching stop layer 118). The glue layer may be made of tantalum nitride (TaN), titanium (Ti), titanium nitride (TiN), another suitable material, or a combination thereof.

A metal bulk layer is then deposited on the glue layer (if formed) to fill the remainder of the contact openings. In some embodiments, the metal bulk layer is formed using a selective deposition technique such as cyclic CVD process or ELD process, and it is not necessary to form a glue layer in the contact openings before depositing the metal bulk material. In some embodiments, the metal bulk layer is made of one or more conductive materials with low resistance and good gap-fill ability, for example, cobalt (Co), nickel (Ni), tungsten (W), titanium (Ti), tantalum (Ta), copper (Cu), rhodium (Rh), iridium (Ir), platinum (Pt), aluminum (Al), ruthenium (Ru), molybdenum (Mo), another suitable metal material, or a combination thereof.

In some embodiments, because the gate cutting structure 134A includes the second dielectric material 132 having lower etching resistance, the interface 134I1 between the contact plug 136A1 and the gate cutting structure 134A is located at a lower position than the interface 134I2 between the contact plug 136B1 and the gate cutting structure 134B.

In the manufacturing processes of the semiconductor structure including the logic devices and the memory devices (e.g., SRAM), the logic devices may focus more on device performance, e.g., speed, while the memory devices may focus more on device density. As the scale of the semiconductor structure continues to shrink, and the spacing between the contact plug and the metal gate electrode becomes smaller and smaller, one of the design challenges of forming the logic devices is to reduce the parasitic capacitance (e.g., out-fringing capacitance (Cof), contact-to-gate capacitance (Cco), etc.) to enhance the device performance, e.g., speed.

In accordance with the embodiments, the gate cutting structures 134A in the logic region 50A have a relatively great width (i.e., the dimension D5), and thus the lateral overlap area between final gate stacks 122A and the contact plugs 136A may be reduced. Therefore, the parasitic capacitance (e.g., Cof and/or Cco) of the logic devices may be reduced, thereby enhancing the performance of the logic devices.

If the ratio (D7/D5) is too small (e.g., the dimension D5 of the gate cutting structure 134A is too great), the risk of the damage to the source/drain feature 116 in the logic region 50A may be increased. If the ratio (D7/D5) is too great (e.g., the dimension D5 of the gate cutting structure 134A is too small, and/or the dimension D7 of the gate cutting structure 134B is too great), the parasitic capacitance of the logic devices may not be reduced sufficiently and/or the risk of the damage to the source/drain feature 116 in the memory cell array region 50B may be increased.

In addition, the gate cutting structure 134A includes the low-k dielectric material 132, which may further reduce the parasitic capacitance, which may further enhance the performance of the logic devices. Furthermore, the gate cutting structures 134B in the memory cell array region 50B have a relatively small width (i.e., dimension D6), and thus the density of the memory devices may be enhanced.

It should be understood that the semiconductor structure 100 may undergo further CMOS processes to form various features over the semiconductor structure, such as a multi-layer interconnect structure (e.g., contact plugs to final gate stacks, conductive vias, metal lines, inter metal dielectric layers, passivation layers, etc.). In some embodiments, the logic device formed in the logic region 50A may be electrically connected to the memory device formed in the memory cell array region 50B through the conductive features of the multilayer interconnect structure.

FIGS. 3-1 and 3-2 illustrate a modification of the semiconductor structure 100 of FIGS. 2G-3 and 2G-4, in accordance with some embodiments of the disclosure. The semiconductor structure 200 of FIGS. 3-1 and 3-2 is similar to the semiconductor structure 100 of FIGS. 2G-3 and 2G-4, except that the interface between the contact plug 136A1 and the gate cutting structure 134A.

In some embodiments, because the second dielectric material 132 has a better etching resistance than the first dielectric material 130, the interface 134I3 between the contact plug 136A1 and the first dielectric material 130 of the gate cutting structure 134A is located at a higher position than the interface 134I4 between the contact plug 136A1 and the second dielectric material 132 of the gate cutting structure 134A. In some embodiments, a portion of the contact plug 136A1 is embedded within the first dielectric material 130 of the gate cutting structure 134A. In some embodiments, the interface 134I3 may be is located at substantially the same position with the interface 134I2 between the contact plug 136B1 and the gate cutting structure 134B.

Figure 4A:
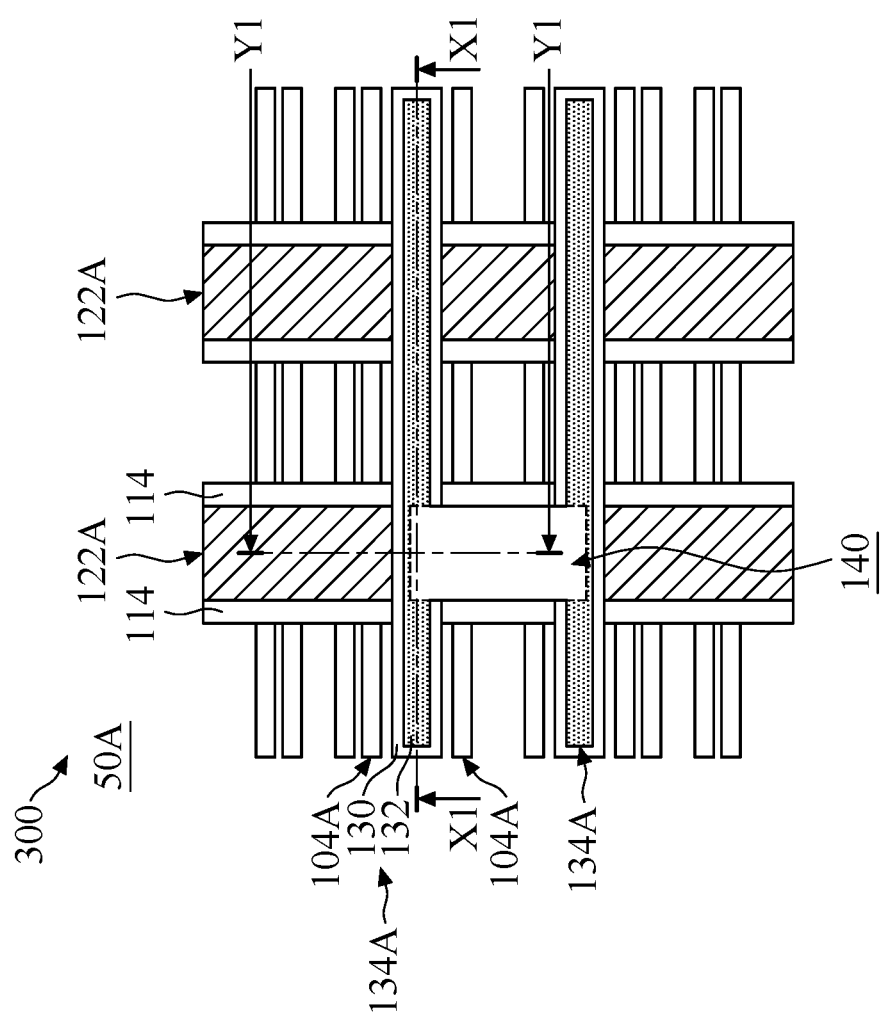
FIGS. 4A, 4B and 4C are plan views illustrating the formation of a semiconductor structure at various intermediate stages, in accordance with some embodiments of the disclosure.
Figures 1, 4A:
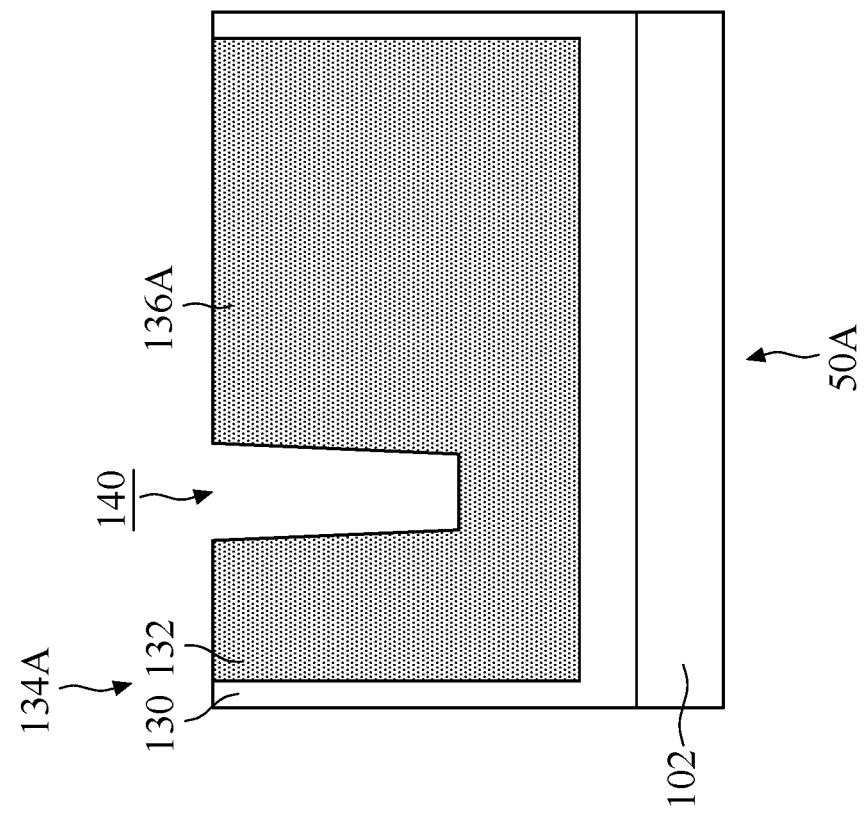
Figures 2, 4A:
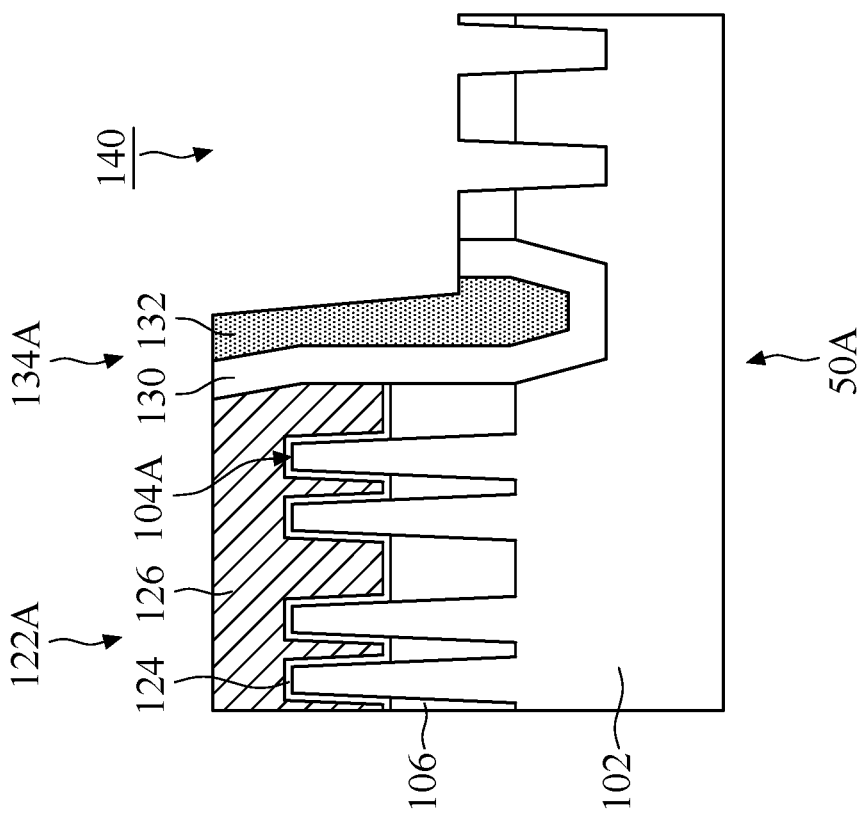
Figure 4B:
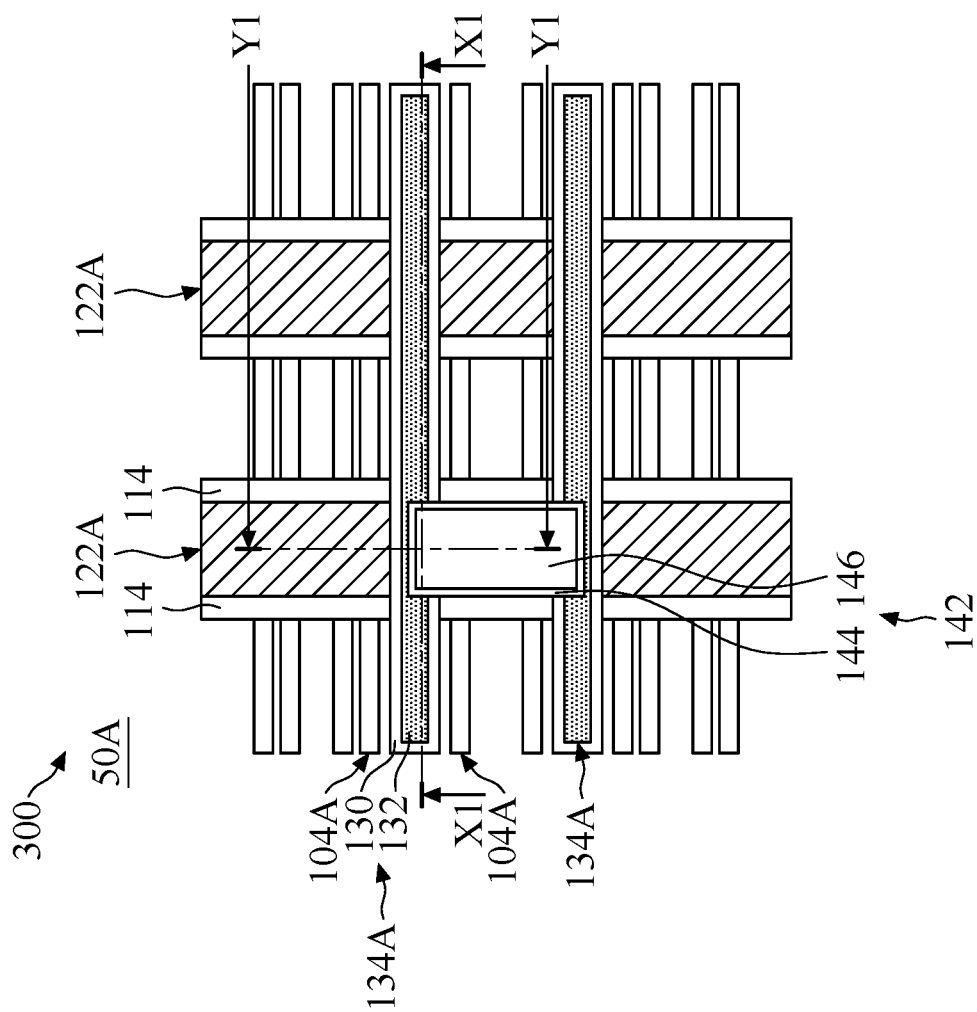
Figure 4C:
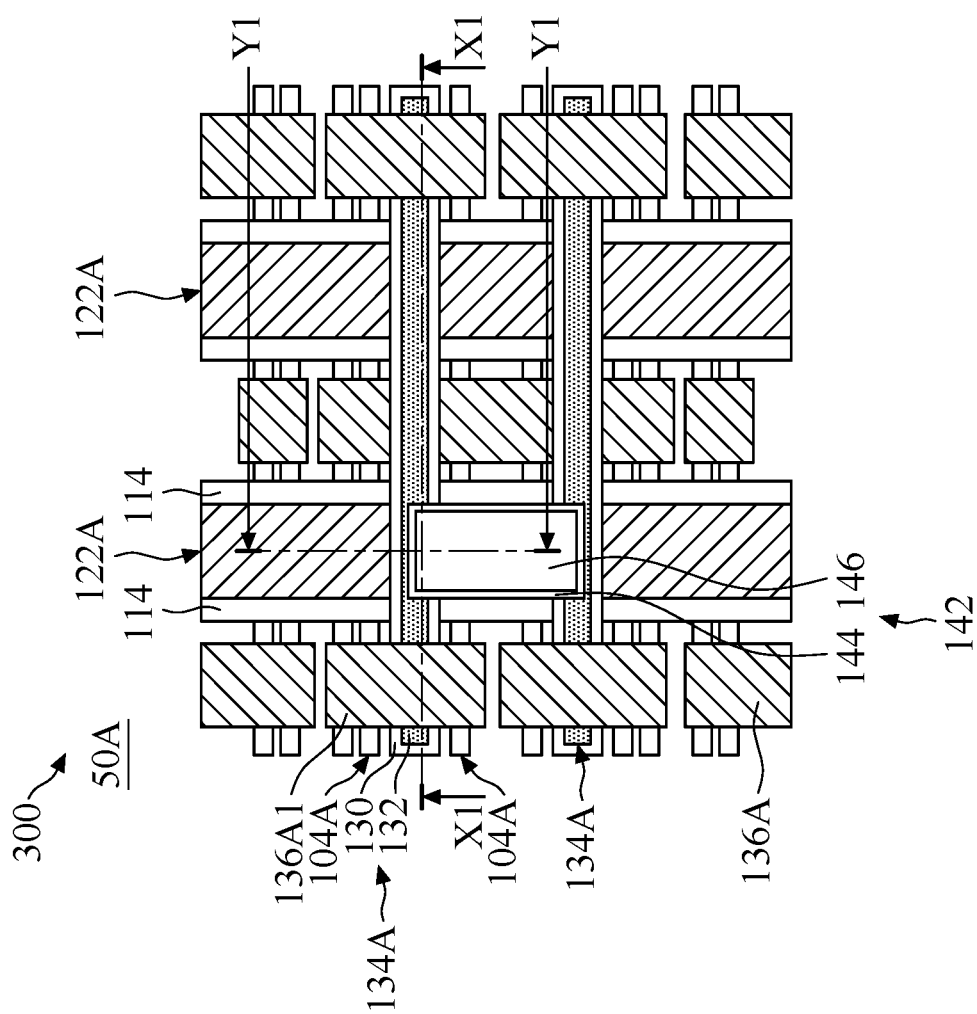
Figures 1, 4C:
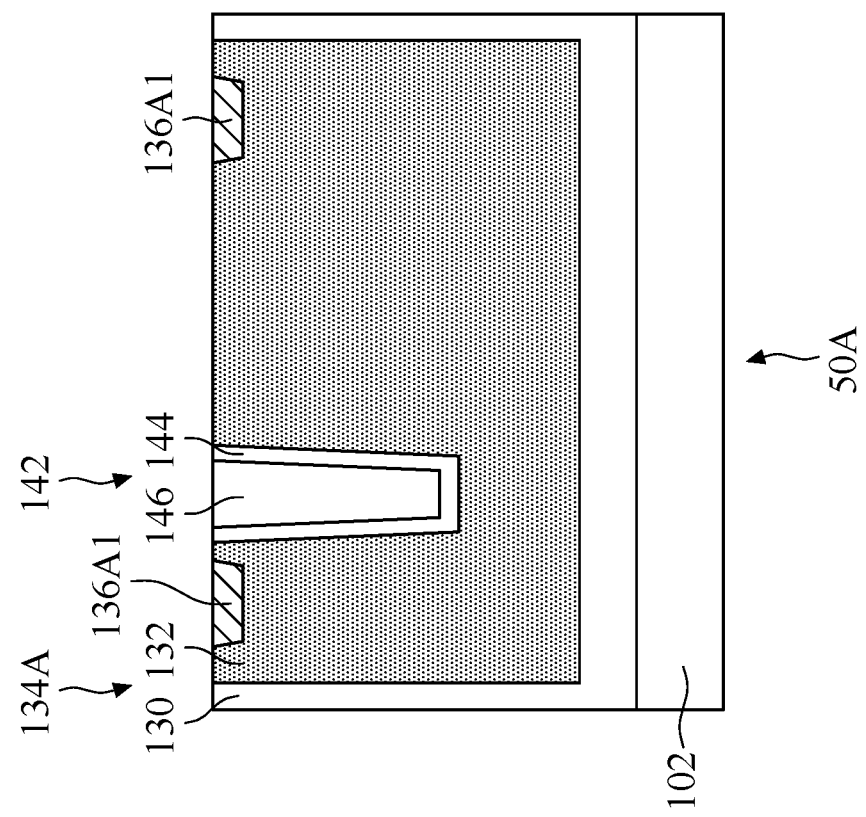
Figures 2, 4C:
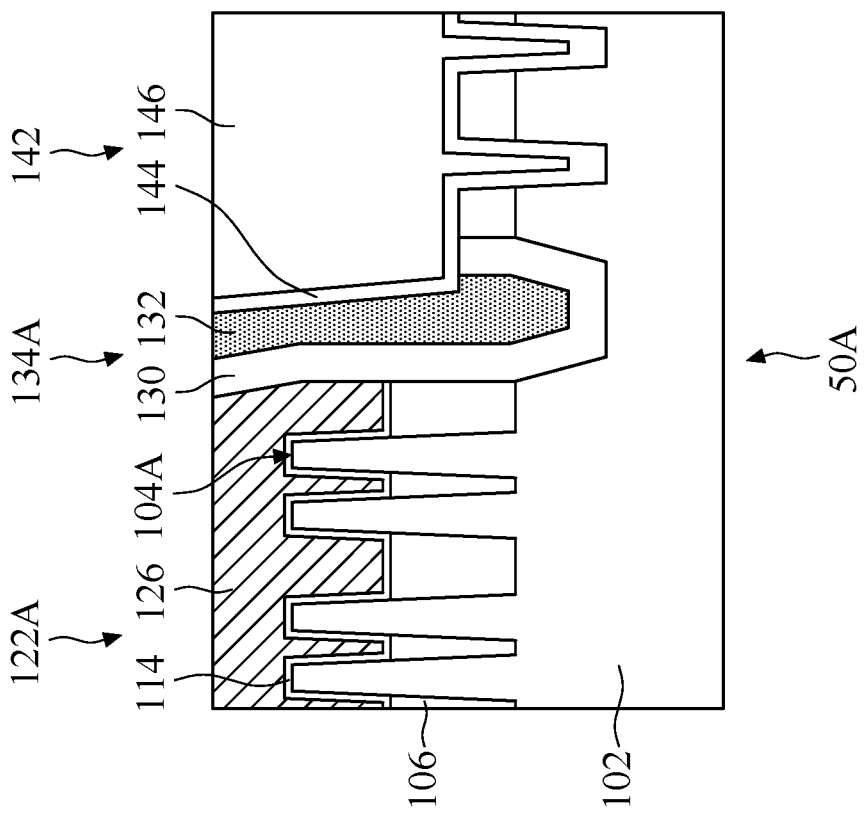

FIGS. 4A, 4B and 4C are plan views illustrating the formation of a semiconductor structure 300 at various intermediate stages, in accordance with some embodiments of the disclosure. The embodiments of FIGS. 4A-4C are similar to the embodiments of FIGS. 2A through 2G, except the formation of a fin cutting structure.

FIGS. 4A through 4A-2 illustrate a semiconductor structure 300 after the formation of a fin cutting trench 140, in accordance with some embodiments. FIGS. 4A-1 and 4A-2 are cross-sectional views of the semiconductor structure 300 taken along line Y1-Y1 and line X1-X1 of FIG. 4A, respectively.

Continuing from FIGS. 2F through 2F-6, a cutting process is performed on the final gate stack 122A and the fin structures 104A, as shown in FIGS. 4A, 4A-1 and 4A-2, in accordance with some embodiments. The cutting process includes patterning the semiconductor structure 300 to form fin cutting trench 140, in accordance with some embodiments. The fin structures 104A are cut into several segments by the fin cutting trench 140, in accordance with some embodiments. In some embodiments, the fin cutting trench 140 further partially cut through the gate cutting structures 134A. The fin cutting trench may be also referred to as cut metal on oxide definition edge (CMODE) pattern.

In some embodiments, the fin cutting trench 140 extends in the Y direction. That is, the fin cutting trench 140 has longitudinal axes parallel to the Y direction, in accordance with some embodiments. That is, the dimension (length) of the fin cutting trench 140 in the Y direction are greater than the dimension (width) of the fin cutting trench 140 in the X direction.

The cutting process includes forming a patterned mask layer over the semiconductor structure 300 using a photolithography process. The patterned mask layer has a trench pattern corresponding to the fin cutting trench 140, in accordance with some embodiments. An etching process is then performed using the patterned mask layer to remove portions of the gate cutting structures 134A, the final gate stack 122A, the fin structures 104A and the substrate 102 that are exposed from the trench pattern, in accordance with some embodiments. The etching processes may include dry etching such as RIE, NBE, ICP etch, CCP, another suitable method, or a combination thereof. In some embodiments, the bottom surface of the fin cutting trench 140 is located at a lower position than the bottom surface of the isolation structure 106.

FIGS. 4B through 4B-2 illustrate a semiconductor structure 300 after the formation of a fin cutting structure 142, in accordance with some embodiments. FIGS. 4B-1 and 4B-2 are cross-sectional views of the semiconductor structure 300 taken along line Y1-Y1 and line X1-X1 of FIG. 4B, respectively.

The third dielectric material 144 is formed over the semiconductor structure 300 to partially fill the fin cutting trench 140, as shown in FIGS. 4B, 4B-1 and 4B-2, in accordance with some embodiments. In some embodiments, the third dielectric material 144 is silicon nitride (SiN), silicon oxynitride (SiON), silicon carbon nitride (SiCN), silicon oxide (SiO$_2$), silicon oxycarbonitride (SiOCN), oxygen-doped silicon carbide (SiC:O), oxygen-doped silicon carbonitride (Si(O)CN), or a combination thereof. In some embodiments, the third dielectric material 144 is deposited using ALD, CVD such as LPCVD, PECVD, HDP-CVD, or HARP, another suitable technique, or a combination thereof.

A fourth dielectric material 146 is formed over the third dielectric material 144 to overfill the remainder of the fin cutting trench 140, as shown in FIG. 4B. 4B-1 and 4B-2, in accordance with some embodiments. The portions of the third dielectric material 144 and the fourth dielectric material 146 that are in the fin cutting trench 140 serve as a fin cutting structure 142, in accordance with some embodiments.

In some embodiments, the fin cutting structure 142 is configured to prevent leakage between neighboring devices. The dimension of the cutting structure 142 in the X direction is substantially equal to the lengths (i.e., gate lengths) of the final gate stack 122A, which may have the smallest critical dimension (CD) in the semiconductor manufacturing process. The formation of the fin cutting structure 142 may facilitate improving the device density.

In some embodiments, the fourth dielectric material 146 is silicon oxide (SiO$_2$), silicon oxycarbonitride (SiOCN), oxygen-doped silicon carbide (SiC:O), oxygen-doped silicon carbonitride (Si(O)CN), silicon carbon nitride (SiCN), silicon oxynitride (SiON), silicon nitride (SiN), or a combination thereof. In some embodiments, the fourth dielectric material 146 is deposited using ALD, CVD such as LPCVD, PECVD, HDP-CVD, HARP, or FCVD, another suitable technique, or a combination thereof.

In some embodiments, the fourth dielectric material 146 and the third dielectric material 144 are made of different materials and have a great difference in etching selectivity. In some embodiments, the dielectric constant of the fourth dielectric material 146 is less than the dielectric constant of the third dielectric material 144. For example, the fourth dielectric material 146 is SiO, SiON, SiCN or SiOCN and the third dielectric material 144 is SiN.

A planarization process is then performed on the semiconductor structure 300 to remove the fourth dielectric material 146 and the third dielectric material 144 formed above the metal gate electrode layer 126, in accordance with some embodiments. The planarization may be CMP, etching back process, or a combination thereof. After the planarization process, the top surfaces of the fourth dielectric material 146, the third dielectric material 144, the second dielectric material 132, the first dielectric material 130, the metal gate electrode layer 126, the gate spacer layers 114, the contact etching stop layer 118 and the interlayer dielectric layer 120 are substantially coplanar, in accordance with some embodiments.

In some embodiments, the bottom surface of the fin cutting structure 142 is located at a lower position than the bottom surface of the isolation structure 106. In some embodiments, the third dielectric material 144 of the fin cutting structure 142 is in direct contact with the first dielectric material 130 and the second dielectric material 132 of the gate cutting structure 134A.

FIGS. 4C through 4C-2 illustrate a semiconductor structure 300 after the formation of contact plugs 136A, in accordance with some embodiments. FIGS. 4C-1 and 4C-2 are cross-sectional views of the semiconductor structure 300 taken along line Y1-Y1 and line X1-X1 of FIG. 4C, respectively. The steps described above with respect to FIGS. 2G through 2G-6 are performed, thereby forming the contact plugs 136A on the source/drain features 116, in accordance with some embodiments.

As described above, the aspect of the present disclosure is directed to forming gate cutting structure. In some embodiments, the logic devices may focus more on device performance. e.g., speed, while the memory devices may focus more on device density. The gate cutting structure 134A in the logic region 50A is greater than the gate cutting structure 134B in the memory cell array region 50B, in accordance with some embodiments. The gate cutting structure 134A with a relatively great width, and thus the parasitic capacitance of the logic devices may be reduced, thereby enhancing the performance of the logic devices. The gate cutting structures 134B have a relatively small width, and thus the density of the memory devices may be improved.

Embodiments of a semiconductor structure are provided. The semiconductor structure may include a first gate stack in a logic region and a second gate stack in a memory cell array region. The semiconductor structure may further include a first gate cutting structure dividing the first gate stack into two segments, and a second gate cutting structure dividing the second gate stack into two segments. The first gate cutting structure may be wider than the second gate cutting structure. Therefore, the performance of the logic devices may be enhanced, and the density of the memory devices may be improved.

In some embodiments, a method for forming a semiconductor structure is provided. The method for forming the semiconductor structure includes forming a first plurality of fin structures and a second plurality of fin structures over a substrate, forming a first gate stack and a second gate stack that extend in a first direction across the first plurality of fin structures and the second plurality of fin structures, respectively, and etching the first gate stack and the second gate stack to form a first trench through the first gate stack and a second trench through the second gate stack. A first dimension of the first trench in the first direction is greater than a second dimension of the second trench in the first direction.

The method further includes forming a first gate cutting structure and a second gate cutting structure in the first trench and the second trench, respectively.

In some embodiments, a method for forming a semiconductor structure is provided. The method for forming the semiconductor structure includes forming a first fin structure and a second fin structure in a first region of a substrate and a third fin structure and a fourth fin structure in a second region of the substrate, forming an interlayer dielectric layer over the source/drain regions of the first fin structure, the second fin structure, the third fin structure and the fourth fin structure, forming a first gate stack over channel regions of the first fin structure and the second fin structure and forming a second gate stack over channel regions of the third fin structure and the fourth fin structure, forming a first trench between the first fin structure and the second fin structure and in the first gate stack and the interlayer dielectric layer and forming a second trench between the third fin structure and the fourth fin structure and in the second gate stack and the interlayer dielectric layer, and depositing a first dielectric material in the first trench and the second trench. The first dielectric material overfills the second trench while the first trench is partially filled with the first dielectric material. The method further includes depositing a second dielectric material in a remaining portion of the first trench.

In some embodiments, a semiconductor structure is provided. The semiconductor structure includes a first fin structure and a second fin structure adjacent to the first fin structure, a first segment and a second segment of a first gate stack across the first fin structure and the second fin structure, respectively, a third fin structure and a fourth fin structure adjacent to the third fin structure, a first segment and a second segment of a second gate stack across the third fin structure and the fourth fin structure, respectively, a first gate cutting structure sandwiched between the first segment and the second segment of the first gate stack, and a second gate cutting structure sandwiched between the first segment and the second segment of the second gate stack. The first gate cutting structure is wider and thicker than the second gate cutting structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
    forming a first plurality of fin structures and a second plurality of fin structures over a substrate;
    forming a first gate stack and a second gate stack that extend in a first direction across the first plurality of fin structures and the second plurality of fin structures, respectively;
    etching the first gate stack and the second gate stack to form a first trench through the first gate stack and a second trench through the second gate stack, wherein a first dimension of the first trench in the first direction is greater than a second dimension of the second trench in the first direction, and a first depth of the first trench is greater than a second depth of the second trench; and
    forming a first gate cutting structure and a second gate cutting structure in the first trench and the second trench, respectively.

2. The method for forming the semiconductor structure as claimed in claim 1, further comprising:
    forming a first dielectric material in the first trench and the second trench until the second trench is overfilled thereby forming the second gate cutting structure, wherein when the formation of the first dielectric material is complete, the first trench is partially filled with the first dielectric material.

3. The method for forming the semiconductor structure as claimed in claim 2, further comprising:
    forming a second dielectric material over the first dielectric material to overfill the first trench, wherein portions of the first dielectric material and the second dielectric material in the first trench form the first gate cutting structure.

4. The method for forming the semiconductor structure as claimed in claim 3, further comprising:
    etching the first gate cutting structure, the first gate stack and a first fin structure in the first plurality of fin structures to form a third trench; and
    forming a fin cutting structure in the third trench, wherein the fin cutting structure is in direct contact with the first dielectric material and the second dielectric material of the first gate cutting structure.

5. The method for forming the semiconductor structure as claimed in claim 1, further comprising:
    forming a first plurality of source/drain features and a second plurality of source/drain features over the first plurality of fin structures and the second plurality of fin structures, respectively;
    forming a first contact plug over the first plurality of source/drain features and the first gate cutting structure; and
    forming a second contact plug over the second plurality of source/drain features and the second gate cutting structure.

6. The method for forming the semiconductor structure as claimed in claim 5, wherein an interface between the first contact plug and the first gate cutting structure is lower than an interface between the second contact plug and the second gate cutting structure.

7. The method for forming the semiconductor structure as claimed in claim 1, wherein:
    the first gate cutting structure is formed between a first fin structure and a second fin structure in the first plurality of fin structures,
    the second gate cutting structure is formed between a third fin structure and a fourth fin structure in the second plurality of fin structures, and
    a first distance between the first fin structure and the second fin structure is greater than a second distance between the third fin structure and the fourth fin structure.

8. The method for forming the semiconductor structure as claimed in claim 1, wherein the first gate stack is cut into two segments electrically insulated from each other by the first gate cutting structure, and the second gate stack is cut into two segments electrically insulated from each other by the second gate cutting structure.

9. A method for forming a semiconductor structure, comprising:

forming a first fin structure and a second fin structure in a first region of a substrate and a third fin structure and a fourth fin structure in a second region of the substrate;

forming an interlayer dielectric layer over source/drain regions of the first fin structure, the second fin structure, the third fin structure and the fourth fin structure;

forming a first gate stack over channel regions of the first fin structure and the second fin structure and forming a second gate stack over channel regions of the third fin structure and the fourth fin structure;

forming a first trench between the first fin structure and the second fin structure and in the first gate stack and the interlayer dielectric layer and forming a second trench between the third fin structure and the fourth fin structure and in the second gate stack and the interlayer dielectric layer;

depositing a first dielectric material in the first trench and the second trench, wherein the first dielectric material overfills the second trench while the first trench is partially filled with the first dielectric material; and depositing a second dielectric material in a remaining portion of the first trench.

10. The method for forming the semiconductor structure as claimed in claim 9, wherein a dielectric constant of the first dielectric material is greater than a dielectric constant of the second dielectric material.

11. The method for forming the semiconductor structure as claimed in claim 9, wherein a portion of the first dielectric material in the second trench forms a gate cutting structure, and the gate cutting structure is free of the second dielectric material.

12. The method for forming the semiconductor structure as claimed in claim 9, further comprising:

forming an isolation structure to surround the first fin structure, the second fin structure, the third fin structure and the fourth fin structure, wherein:

the interlayer dielectric layer, the first gate stack and the second gate stack are formed over the isolation structure, a bottom surface of the first trench is lower than a bottom surface of the isolation structure, and a bottom surface of the second trench is higher than the bottom surface of the isolation structure.

13. The method for forming the semiconductor structure as claimed in claim 9, wherein the first trench and the second trench extend in a first direction, the first trench has a first dimension in a second direction perpendicular to the first direction, the second trench has a second dimension in the second direction, and a ratio of the second dimension to the first dimension is in a range from about 0.3 to about 0.8.

14. The method for forming the semiconductor structure as claimed in claim 9, wherein a first region of the substrate is a logic region and a second region of the substrate is a memory cell array region.

15. A method for forming a semiconductor structure, comprising:

forming first, second, third and fourth fin structures extending lengthwise along a first horizontal direction over a substrate, wherein a spacing between the first and second fin structures is greater than a spacing between the third and fourth fin structures;

forming an isolation structure to surround lower portions of the first, second, third and fourth fin structures;

forming a first gate stack across upper portions of the first and second fin structures and a second gate stack across upper portions of the third and fourth fin structures, wherein the first and second gate stacks extend lengthwise along a second horizontal direction that is different than the first horizontal direction;

forming a first gate cutting structure through the first gate stack and a first portion of the isolation structure between the first and second fin structures; and forming a second gate cutting structure through the second gate stack and a second portion of the isolation structure between the third and fourth fin structures, wherein a first dimension of the first gate cutting structure in the second horizontal direction is greater than a second dimension of the second gate cutting structure in the second horizontal direction.

16. The method for forming the semiconductor structure as claimed in claim 15, wherein a third dimension of the first gate cutting structure in a vertical direction is greater than a fourth dimension of the second gate cutting structure in the vertical direction.

17. The method for forming the semiconductor structure as claimed in claim 15, wherein the first gate cutting structure includes a first dielectric material, and a second dielectric material over the first dielectric material and different than the first dielectric material, and wherein the second gate cutting structure includes the first dielectric material.

18. The method for forming the semiconductor structure as claimed in claim 17, wherein the second gate cutting structure is free of the second dielectric material.

19. The method for forming the semiconductor structure as claimed in claim 16, further comprising:

first and second source/drain features respectively on the first and second fin structures; and a contact plug continuously extending over the first source/drain feature, the first gate cutting structure and the second source/drain feature, wherein the first gate cutting structure includes a first dielectric material and a second dielectric material on the first dielectric material, and an interface between the first dielectric material and the contact plug is higher than an interface between the second dielectric material and the contact plug.

20. The method for forming the semiconductor structure as claimed in claim 1, wherein the first plurality of the fin structures is formed in a logic region, and the second plurality of the fin structures is formed in a memory cell array region.

* * * * *